(12) United States Patent
Won et al.

(10) Patent No.: US 12,048,184 B2
(45) Date of Patent: Jul. 23, 2024

(54) DISPLAY DEVICE

(71) Applicant: SAMSUNG DISPLAY CO., LTD., Yongin-si (KR)

(72) Inventors: Seonggeun Won, Hwaseong-si (KR); Jaekyung Go, Yongin-si (KR); Yongseung Park, Gyeonggi-do (KR); Minjun Jo, Cheonan-si (KR); Hyunmin Hwang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/326,616

(22) Filed: May 31, 2023

(65) Prior Publication Data
US 2023/0309336 A1 Sep. 28, 2023

Related U.S. Application Data

(63) Continuation of application No. 16/508,836, filed on Jul. 11, 2019, now Pat. No. 11,700,742.

(30) Foreign Application Priority Data

Oct. 2, 2018 (KR) .......................... 10-2018-0117578

(51) Int. Cl.
*H10K 50/842* (2023.01)
*H10K 59/121* (2023.01)

(52) U.S. Cl.
CPC ....... *H10K 50/8426* (2023.02); *H10K 59/121* (2023.02)

(58) Field of Classification Search
CPC .......................... H10K 50/8426; H10K 59/121
See application file for complete search history.

(56) References Cited

U.S. PATENT DOCUMENTS

| | | | | |
|---|---|---|---|---|
| 11,289,677 | B2 * | 3/2022 | Xing | ...................... H10K 50/87 |
| 11,310,924 | B2 * | 4/2022 | Jin | ....................... G06F 1/1626 |
| 2015/0194625 | A1 | 7/2015 | Kim | |
| 2017/0077192 | A1 | 3/2017 | Jang | |

(Continued)

FOREIGN PATENT DOCUMENTS

| CN | 103258477 | 8/2013 |
|---|---|---|
| CN | 106980256 | 7/2017 |

(Continued)

OTHER PUBLICATIONS

Extended European Search Report Dated Feb. 21, 2020 In Corresponding European Application No. 19200949.6.

(Continued)

*Primary Examiner* — Mary Ellen Bowman
(74) *Attorney, Agent, or Firm* — F. Chau & Associates, LLC

(57) ABSTRACT

A display device includes a first substrate including a display area and a non-display area, a display element disposed on the first substrate in the display area, a first sealing portion disposed on the first substrate in the non-display area, a second substrate facing the first substrate in a thickness direction, a hole defined through the first substrate and the second substrate along the thickness direction in the display area, and a second sealing portion disposed between the first substrate and the second substrate and enclosing the hole.

9 Claims, 15 Drawing Sheets

(56) References Cited

U.S. PATENT DOCUMENTS

| | | | |
|---|---|---|---|
| 2017/0162111 A1 | 6/2017 | Kang et al. | |
| 2017/0162637 A1 | 6/2017 | Choi et al. | |
| 2017/0185184 A1 | 6/2017 | Kim | |
| 2017/0205771 A1* | 7/2017 | Lin | ............ H10K 59/00 |
| 2018/0151834 A1 | 5/2018 | Kanaya | |
| 2020/0106042 A1 | 4/2020 | Won et al. | |

FOREIGN PATENT DOCUMENTS

| | | |
|---|---|---|
| CN | 107236927 | 10/2017 |
| CN | 108559948 | 9/2018 |
| JP | 2018-087863 | 6/2018 |
| KR | 10-2017-0031850 | 3/2017 |
| KR | 1020170065059 | 6/2017 |
| KR | 1020170066767 | 6/2017 |
| KR | 10-2017-0086387 | 7/2017 |
| KR | 1020170077910 | 7/2017 |
| KR | 1020170137230 | 12/2017 |

OTHER PUBLICATIONS

Office Action dated Jan. 29, 2021 in corresponding U.S. Appl. No. 16/508,836.

Office Action dated on Oct. 28, 2023 in connection with a counterpart Chinese Patent Application No. 201910948707.8.

Office action dated on Nov. 28, 2023 in connection with a counterpart Korean Patent Application No. 10-2018-0117578.

* cited by examiner

DISPLAY DEVICE

CROSS-REFERENCE TO RELATED APPLICATIONS

This application is a continuation of U.S. patent application Ser. No. 16/508,836 filed Jul. 11, 2019, which claims priority under 35 U.S.C. § 119 to Korean Patent Application No. 10-2018-0117578, filed on Oct. 2, 2018 in the Korean Intellectual Property Office (KIPO), the disclosures of which are incorporated by reference herein in their entirety.

TECHNICAL FIELD

Exemplary embodiments of the present invention relate to a display device, and more particularly, to a display device having a through hole.

DISCUSSION OF THE RELATED ART

Flat panel display (FPD) devices have advantages of reduced weight and volume compared to cathode ray tube (CRT) devices. Examples of such FPD devices include liquid crystal display (LCD) devices, field emission display (FED) devices, plasma display panel (PDP) devices and organic light emitting diode (OLED) display devices.

SUMMARY

Exemplary embodiments of the present invention are directed to a display device having a through hole.

According to an exemplary embodiment, a display device includes a first substrate including a display area and a non-display area, a display element disposed on the display area of the first substrate, a first sealing portion disposed on the non-display area of the first substrate, a second substrate facing the first substrate in a first direction, a hole defined through the first substrate and the second substrate along the first direction in the display area, and a second sealing portion disposed between the first substrate and the second substrate and enclosing the hole.

In an exemplary embodiment, the first substrate further includes a dummy area located between the first sealing portion and the second sealing portion.

In an exemplary embodiment, the dummy area is located between the second sealing portion and one side of the first sealing portion that is disposed closest to the second sealing portion.

In an exemplary embodiment, the dummy area has a polygonal shape including four sides.

In an exemplary embodiment, each of a third side and a fourth side of the dummy area that are disposed along a second direction in which long sides of the first sealing portion face each other has a curved line shape, and a first side and a second side of the dummy area that are disposed along a third direction in which short sides of the first sealing portion face each other have a straight line shape and a curved line shape, respectively.

In an exemplary embodiment, a distance between the third side and the fourth side gradually increases along the third direction from the one side of the first sealing portion that is disposed closest to the second sealing portion toward the second sealing portion.

In an exemplary embodiment, a curvature of the third side is substantially equal to a curvature of the fourth side.

In an exemplary embodiment, the second sealing portion has a circular shape, and a curvature of the second sealing portion is substantially equal to or less than a curvature of the first side.

In an exemplary embodiment, the first side is adjacent to the first sealing portion, the second side is adjacent to the second sealing portion, and a length of the second side is greater than a length of the first side.

In an exemplary embodiment, each of a third side and a fourth side of the dummy area that are disposed along a second direction in which long sides of the first sealing portion face each other has a straight line shape, and a first side and a second side of the dummy area that are disposed along a third direction in which short sides of the first sealing portion face each other have a straight line shape and a curved line shape, respectively.

In an exemplary embodiment, a distance between the third side and the fourth side gradually decreases along the third direction from the one side of the first sealing portion that is disposed closest to the second sealing portion toward the second sealing portion.

In an exemplary embodiment, the first side is adjacent to the first sealing portion, the second side is adjacent to the second sealing portion, and a length of the second side is greater than a length of the first side.

In an exemplary embodiment, the display element includes a light emitting layer, and the light emitting layer is selectively disposed only in the display area of the display area and the dummy area.

In an exemplary embodiment, a hole injecting layer, a hole transporting layer, an electron transporting layer, and an electron injecting layer are further selectively disposed only in the display area of the display area and the dummy area.

In an exemplary embodiment, the display device further includes an insulating layer having a concavo-convex shape disposed in the dummy area.

In an exemplary embodiment, no pattern layer exists in the dummy area.

In an exemplary embodiment, a width of the second sealing portion is less than a width of the first sealing portion.

In an exemplary embodiment, the display device further includes at least one of a first heat transfer layer disposed between the first substrate and the first sealing portion, and a second heat transfer layer disposed between the first substrate and the second sealing portion.

In an exemplary embodiment, the first heat transfer layer contacts the first sealing portion, and the second heat transfer layer contacts the second sealing portion.

In an exemplary embodiment, the non-display area of the first substrate includes a pad area that does not overlap the second substrate, and a non-pad area that overlaps the second substrate. A first side of first and second sides of the first sealing portion that face each other is more adjacent to the non-pad area, and the second sealing portion is more adjacent to either one of the first side and the second side.

BRIEF DESCRIPTION OF THE DRAWINGS

The above and other features of the present invention will become more apparent by describing in detail exemplary embodiments thereof with reference to the accompanying drawings, wherein.

DETAILED DESCRIPTION

Figure 1:
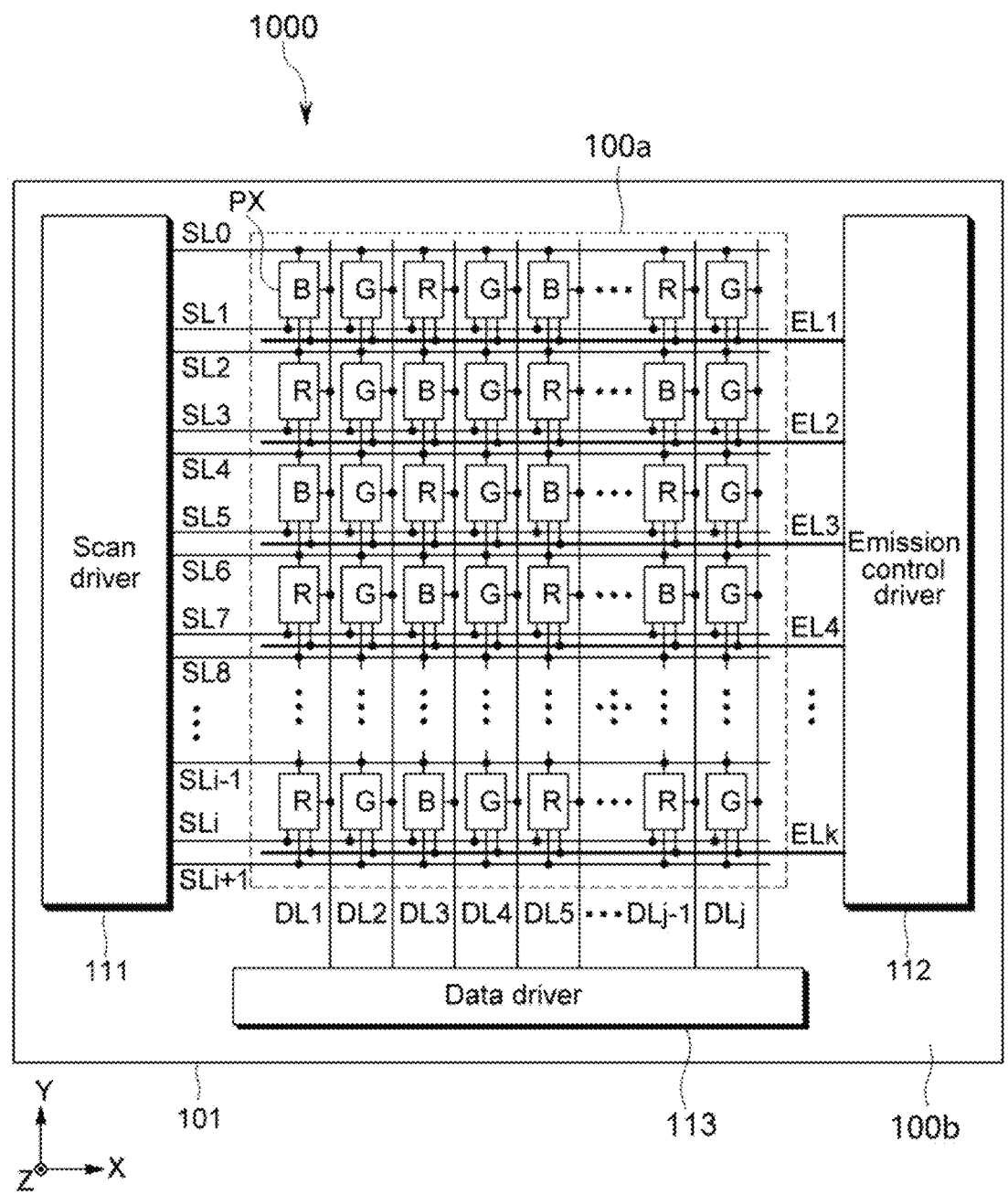
FIG. 1 is a block diagram illustrating a display device according to an exemplary embodiment.

Exemplary embodiments will be described more fully hereinafter with reference to the accompanying drawings. Like reference numerals may refer to like elements throughout the accompanying drawings.

When a layer, area, or plate is referred to as being "on" another layer, area, or plate, it may be directly on the other layer, area, or plate, or intervening layers, areas, or plates may be present therebetween. Further, when a layer, area, or plate is referred to as being "below" another layer, area, or plate, it may be directly below the other layer, area, or plate, or intervening layers, areas, or plates may be present therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in a case in which a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being 'on', 'connected to', 'coupled to', or 'adjacent to' another element, it can be directly on, connected to, coupled to, or adjacent to the other element, or intervening elements may also be present. When an element is referred to as being connected to another element, the element may be electrically connected to the other element.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Hereinafter, a display device according to an exemplary embodiment will be described in detail with reference to FIGS. 1 to 13C.

FIG. 1 is a block diagram illustrating a display device according to an exemplary embodiment.

A display device 1000 according to an exemplary embodiment of the present invention includes a substrate 101, a scan driver 111, an emission control driver 112, and a data driver 113, as illustrated in FIG. 1.

On the substrate 101, i+2 number of scan lines SL0 to SLi+1, k number of emission control lines EL1 to ELk, j number of data lines DL1 to DLj, k*j number of pixels PX, the scan driver 111, the emission control driver 112 and the data driver 113 are disposed, where each of i, j and k is a natural number greater than 1.

The plurality of pixels PX are located in a display area 100a of the substrate 101.

The i+2 number of scan lines SL0 to SLi+1, the k number of emission control lines EL1 to ELk, and the j number of data lines DL1 to DLj are located at the display area 100a of the substrate 101. In such an exemplary embodiment, the i+2 number of scan lines SL0 to SLi+1 extend to a non-display area 100b and are connected to the scan driver 111, the k number of emission control lines EL1 to Elk extend to the non-display area 100b and are connected to the emission control driver 112, and the j number of data lines DL1 to DLj extend to the non-display area 100b and are connected to the data driver 113.

The scan driver 111 and the emission control driver 112 may be manufactured on the substrate 101 through a process substantially the same as a process in which the pixel PX is disposed. For example, switching elements of the scan driver 111, switching elements of the emission control driver 112, and switching elements of the pixel PX may be disposed on the substrate 101 through a photolithography process.

In an exemplary embodiment, the emission control driver 112 may be embedded in the scan driver 111. For example, the scan driver 111 may further serve the function of the emission control driver 112. In such an exemplary embodiment, the scan lines SL0 to SLi+1 and the emission control lines EL1 to ELk are driven together by the scan driver 111.

The data driver 113 may be manufactured in the form of a chip. The data driver 113 may be attached on the substrate 101 in a chip bonding manner. In an exemplary embodiment, the data driver 113 may be disposed on a separate printed circuit board (PCB) instead of the substrate 101, in which case the data lines DL1 to DLj are connected to the data driver 113 through the PCB.

In an exemplary embodiment, each of the scan driver 111 and the emission control driver 112 may be manufactured in the form of a chip. The chip-type scan driver 111 may be located in the non-display area 100b of the substrate 101 or at another separate PCB. The chip-type emission control driver 112 may be located in the non-display area 100b of the substrate 101 or at another separate PCB.

The scan lines SL0 to SLi+1 are arranged along a Y-axis direction, and each of the scan lines SL0 to SLi+1 extends along an X-axis direction. The emission control lines EL1 to ELk are arranged along the Y-axis direction, and each of the emission control lines EL1 to ELk extends along the X-axis direction. The data lines DL1 to DLj are arranged along the X-axis direction, and each of the data lines DL1 to DLj extends along the Y-axis direction.

Of the aforementioned scan lines SL0 to SLi+1, a scan line SL0 that is furthest from the data driver 113 is defined as a first dummy scan line SL0, and a scan line SLi+1 that is closest to the data driver 113 is defined as a second dummy scan line SLi+1. In addition, the scan lines SL1 to SLi between the first dummy scan line SL0 and the second dummy scan line SLi+1 are respectively defined as first to i-th scan lines SL1 to SLi sequentially from a scan line that is furthest from the data driver 113.

The scan driver 111 generates scan signals according to a scan control signal provided from a timing controller, and sequentially applies the scan signals to the plurality of scan lines SL0 to SLi+1. The scan driver 111 outputs first to i-th scan signals, a first dummy scan signal, and a second dummy scan signal. The first to i-th scan signals output from the scan driver 111 are applied to the first to i-th scan lines SL1 to SLi, respectively. For example, an n-th scan signal is applied to an n-th scan line SLn, where n is a natural number greater than or equal to 1 and less than or equal to i. In addition, the first dummy scan signal output from the scan driver 111 is applied to the first dummy scan line SL0, and the second dummy scan signal output from the scan driver 111 is applied to the second dummy scan line SLi+1.

During one frame period, the scan driver 111 outputs the first to i-th scan signals sequentially from the first scan signal. In such an exemplary embodiment, the scan driver 111 outputs the first dummy scan signal prior to the first scan signal, and outputs the second dummy scan signal subsequent to the i-th scan signal. For example, the scan driver 111 outputs the first dummy scan signal first during said one frame period, and outputs the second dummy scan signal last during the one frame period. Accordingly, during one frame period, the entire scan lines SL0 to SLi+1 including the dummy scan lines SL0 and SLi+1 are driven sequentially from the first dummy scan line SL0.

The emission control driver 112 generates emission control signals according to a control signal provided from a timing controller and sequentially applies the emission control signals to the plurality of emission control lines EL1 to ELk. First to m-th emission control signals output from the emission control driver 112 are applied to first to m-th emission control lines EL1 to ELm, respectively. In an exemplary embodiment, an m-th emission control signal is applied to an m-th emission control line ELm, where m is a natural number greater than or equal to 1 and less than or equal to k. During one frame period, the emission control driver 112 outputs the first to k-th emission control signals sequentially from the first emission control line ELL. Accordingly, during one frame period, the entire emission control lines EL1 to ELk are driven sequentially from the first emission control line ELL The data driver 113 applies first to j-th data voltages to the first to j-th data lines DL1 to DLj, respectively. In an exemplary embodiment, the data driver 113 receives image data signals and a data control signal from a timing controller. In addition, the data driver 113 samples the image data signals according to the data control signal, sequentially latches the sampled image data signals corresponding to one horizontal line in each horizontal period, and applies the latched image data signals to the data lines DL1 to DLj substantially simultaneously.

The pixels PX may be disposed on the substrate 101 in the display area 100a in the form of a matrix. The pixels PX emit lights having different colors from each other. For example, of pixels PX illustrated in FIG. 1, a pixel indicated by a reference character R is a red pixel which emits a red light, a pixel indicated by a reference character G is a green pixel which emits a green light, and a pixel indicated by a reference character B is a blue pixel which emits a blue light.

In an exemplary embodiment, the display device may further include at least one white pixel which emits a white light. The white pixel may be disposed on the substrate 101 in the display area 100a.

One pixel is connected to at least one scan line. For example, as illustrated in FIG. 1, of a plurality of pixels PX connected to the first data line DL1, a blue pixel that is closest to an upper edge of the substrate 101 is connected to three scan lines that receive scan signals having different output timings, e.g., the first dummy scan line SL0, the first scan line SL1 and the second scan line SL2. In such an exemplary embodiment, the upper edge of the substrate 101 refers to an edge of the substrate 101 that faces the data driver 113 with the display area 100a disposed therebetween.

In an exemplary embodiment, of a plurality of pixels PX connected to the second data line DL2, a green pixel that is third closest to the upper edge of the substrate 101 is connected to three scan lines that receive scan signals having different output timings, e.g., the fourth scan line SL4, the fifth scan line SL5 and the sixth scan line SL6.

In an exemplary embodiment, pixels that are connected in common to a same data line and located adjacent to each other are connected in common to at least one scan line. For example, two adjacent ones of the pixels connected to a same data line that are adjacent to each other in the Y-axis direction share at least one scan line. In an exemplary embodiment, for example, a green pixel (hereinafter referred to as a first green pixel) that is connected to the second data line DL2 and is closest to the upper edge of the substrate 101 and a green pixel (hereinafter referred to as a second green pixel) that is connected to the second data line DL2 and is second closest to the upper edge of the substrate 101 are located adjacent to each other, and the first green pixel and the second green pixel are connected in common to the second scan line SL2. In an exemplary embodiment, when defining a green pixel that is connected to the second data line DL2 and is third closest to the upper edge of the substrate 101 as a third green pixel, the third green pixel and the second green pixel are connected in common to the fourth scan line SL4.

Pixels that are connected in common to a same data line are independently connected to one or more different scan lines. In an exemplary embodiment, for example, the first green pixel described above is connected independently to the first scan line SL1, the second green pixel described above is connected independently to the third scan line SL3, and the third green pixel described above is connected independently to the fifth scan line SL5.

As such, each of pixels connected to a same data line is independently connected to at least one scan line. As used herein, the meaning of at least two pixels (e.g., a first pixel and a second pixel) being connected to different scan lines is that at least one of scan lines connected to the first pixel is different from at least one of scan lines connected to the second pixel. Accordingly, pixels connected to a same data line are connected to different scan lines, respectively.

Alternatively, as used herein, the meaning of at least two pixels (e.g., a first pixel and a second pixel) being connected to a same scan line is that scan lines connected to the first pixel are completely the same as scan lines connected to the second pixel. Accordingly, each of pixels connected to a same emission control line is connected to the same scan lines. For example, in an exemplary embodiment, pixels connected in common to the second emission control line EL2 are connected in common to the second scan line SL2, the third scan line SL3 and the fourth scan line SL4.

The red pixel and the blue pixel are connected to a (2p−1)-th data line, and the green pixel is connected to a 2p-th data line, where p is a natural number. In an exemplary embodiment, for example, the red pixel and the blue pixel are connected to the first data line DL1, and the green pixel is connected to the second data line DL2.

One pixel (hereinafter referred to as a first predetermined pixel) connected to a (2p−1)-th data line (e.g., the first data line DL1) and one pixel (hereinafter referred to as a second predetermined pixel) connected to another (2p−1)-th data line (e.g., the third data line DL3) may be connected to a same scan line, and in such an exemplary embodiment, the first predetermined pixel emits a light having a color different from a color of a light emitted from the second predetermined pixel. In an exemplary embodiment, for example, the first predetermined pixel may be a blue pixel connected to the first dummy scan line SL0, the first scan line SL1, the second scan line SL2, and the first data line DL1, and the second predetermined pixel may be a red pixel connected to the first dummy scan line SL0, the first scan line SL1, the second scan line SL2, and the third data line DL3.

Two adjacent pixels that are connected to a same data line (e.g., the (2p−1)-th data line) and emit lights having different colors from each other, and at least one green pixel adjacent to one of the two adjacent pixels, are included in a unit pixel for displaying a unit image. In an exemplary embodiment, for example, a red pixel connected to the third data line DL3 and the first scan line SL1, a blue pixel connected to the third data line DL3 and the third scan line SL3, a green pixel connected to the second data line DL2 and the first scan line SL1, and a green pixel connected to the fourth data line DL4 and the first scan line SL1 may collectively define a unit pixel.

Each pixel PX commonly receives a high potential driving voltage ELVDD, a low potential driving voltage ELVSS and an initializing voltage Vinit from a power supply. In such an exemplary embodiment, each pixel PX receives all of the high potential driving voltage ELVDD, the low potential driving voltage ELVSS and the initializing voltage Vinit.

Figure 2:
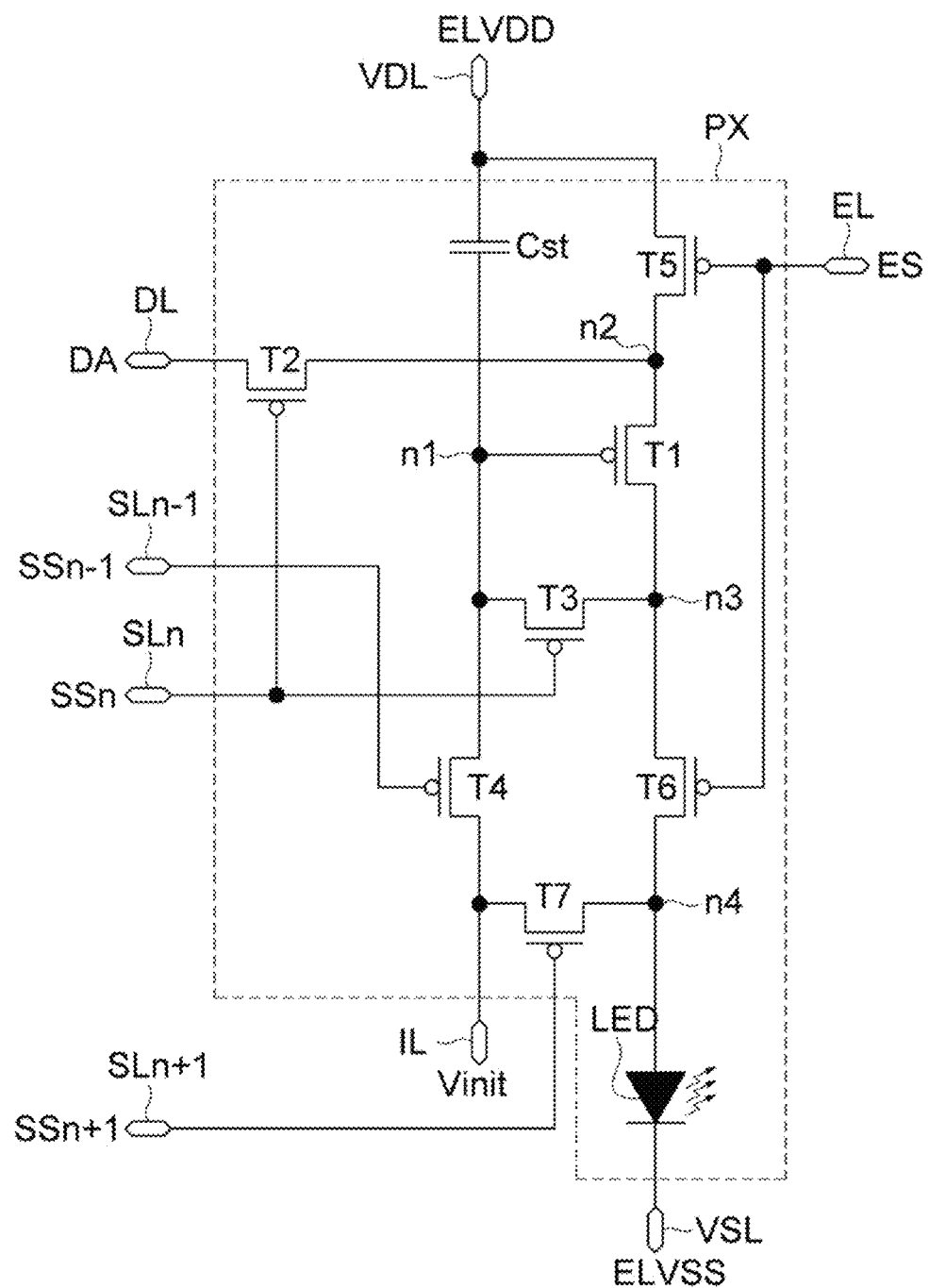
FIG. 2 is an equivalent circuit diagram illustrating one of pixels illustrated in FIG. 1.

FIG. 2 is an equivalent circuit diagram illustrating one of pixels illustrated in FIG. 1.

In an exemplary embodiment, a pixel PX may include a first switching element T1, a second switching element T2, a third switching element T3, a fourth switching element T4, a fifth switching element T5, a sixth switching element T6, a seventh switching element T7, a storage capacitor Cst and a light emitting element (hereinafter referred to as a light emitting diode (LED)).

Each of the first, second, third, fourth, fifth, sixth and seventh switching elements T1, T2, T3, T4, T5, T6 and T7 may be a P-type transistor, as illustrated in FIG. 2. However, exemplary embodiments are not limited thereto. For example, in an exemplary embodiment, each of the first, second, third, fourth, fifth, sixth and seventh switching elements T1, T2, T3, T4, T5, T6 and T7 may be an N-type transistor.

The first switching element T1 includes a gate electrode connected to a first node n1 and is connected between a second node n2 and a third node n3. One of a source electrode and a drain electrode of the first switching element T1 is connected to the second node n2, and the other of the source electrode and the drain electrode of the first switching element T1 is connected to the third node n3.

The second switching element T2 includes a gate electrode connected to an n-th scan line SLn, and is connected between the data line DL and the second node n2. One of a source electrode and a drain electrode of the second switching element T2 is connected to the data line DL, and the other of the source electrode and the drain electrode of the second switching element T2 is connected to the second node n2. An n-th scan signal SSn is applied to the n-th scan line SLn.

The third switching element T3 includes a gate electrode connected to the n-th scan line SLn, and is connected between the first node n1 and the third node n3. One of a source electrode and a drain electrode of the third switching element T3 is connected to the first node n1, and the other of the source electrode and the drain electrode of the third switching element T3 is connected to the third node n3.

The fourth switching element T4 includes a gate electrode connected to an (n−1)-th scan line SLn−1, and is connected between the first node n1 and an initialization line IL. One of a source electrode and a drain electrode of the fourth switching element T4 is connected to the first node n1, and the other of the source electrode and the drain electrode of the fourth switching element T4 is connected to the initialization line IL. The initializing voltage Vinit is applied to the initialization line IL, and an (n−1)-th scan signal SSn−1 is applied to the (n−1)-th scan line SLn-1.

The fifth switching element T5 includes a gate electrode connected to the emission control line EL, and is connected between the second node n2 and a high potential line VDL which is one of power supply lines. One of a source electrode and a drain electrode of the fifth switching element T5 is connected to the high potential line VDL, and the other of the source electrode and the drain electrode of the fifth switching element T5 is connected to the second node n2. The high potential driving voltage ELVDD is applied to the high potential line VDL.

The sixth switching element T6 includes a gate electrode connected to the emission control line EL, and is connected between the third node n3 and a fourth node n4. One of a source electrode and a drain electrode of the sixth switching element T6 is connected to the third node n3, and the other of the source electrode and the drain electrode of the sixth switching element T6 is connected to the fourth node n4. An emission control signal ES is applied to the emission control line EL.

The seventh switching element T7 includes a gate electrode connected to an (n+1)-th scan line SLn+1, and is connected between the initialization line IL and the fourth node n4. One of a source electrode and a drain electrode of the seventh switching element T7 is connected to the initialization line IL, and the other of the source electrode and the drain electrode of the seventh switching element T7 is connected to the fourth node n4. An (n+1)-th scan signal SSn+1 is applied to the (n+1)-th scan line SLn+1.

The storage capacitor Cst is connected between the high potential line VDL and the first node n1. The storage capacitor Cst stores a signal applied to the gate electrode of the first switching element T1 for one frame period.

The LED emits light corresponding to a driving current applied through the first switching element T1. The LED emits light with different brightnesses depending on a magnitude of the driving current. An anode electrode of the LED is connected to the fourth node n4, and a cathode electrode of the LED is connected to a low potential line VSL which is another of the power supply lines. The low potential driving voltage ELVSS is applied to this low potential line VSL. The LED may be an organic light emitting diode (OLED). The anode electrode of the LED corresponds to a pixel electrode to be described below, and the cathode electrode of the LED corresponds to a common electrode to be described below.

The fourth switching element T4 is turned on when the (n−1)-th scan signal SSn−1 is applied to the (n−1)-th scan line SLn−1. The initializing voltage Vinit is applied to the first node n1 (e.g., the gate electrode of the first switching element T1) through the turned-on fourth switching element T4. Accordingly, a voltage of the gate electrode of the first switching element T1 is initialized.

The second switching element T2 and the third switching element T3 are turned on when the n-th scan signal SSn is applied to the n-th scan line SLn. A data voltage DA is applied to the first node n1 (e.g., the gate electrode of the first switching element T1) through the turned-on second switching element T2, and accordingly, the first switching element T1 is turned on. Accordingly, a threshold voltage of the first switching element T1 is detected, and the threshold voltage is stored in the storage capacitor Cst.

The fifth switching element T5 and the sixth switching element T6 are turned on when the emission control signal ES is applied to the emission control line EL. A driving current is applied to the LED through the fifth switching element T5, the first switching element T1, and the sixth switching element T6 that are turned on, such that the LED emits light.

The seventh switching element T7 is turned on when the (n+1)-th scan signal SSn+1 is applied to the (n+1)-th scan line SLn+1. The initializing voltage Vinit is applied to the fourth node n4 (e.g., the anode electrode of the LED) through the turned-on seventh switching element T7. Accordingly, the LED is biased in a reverse direction such that the LED is turned off.

Figure 3:
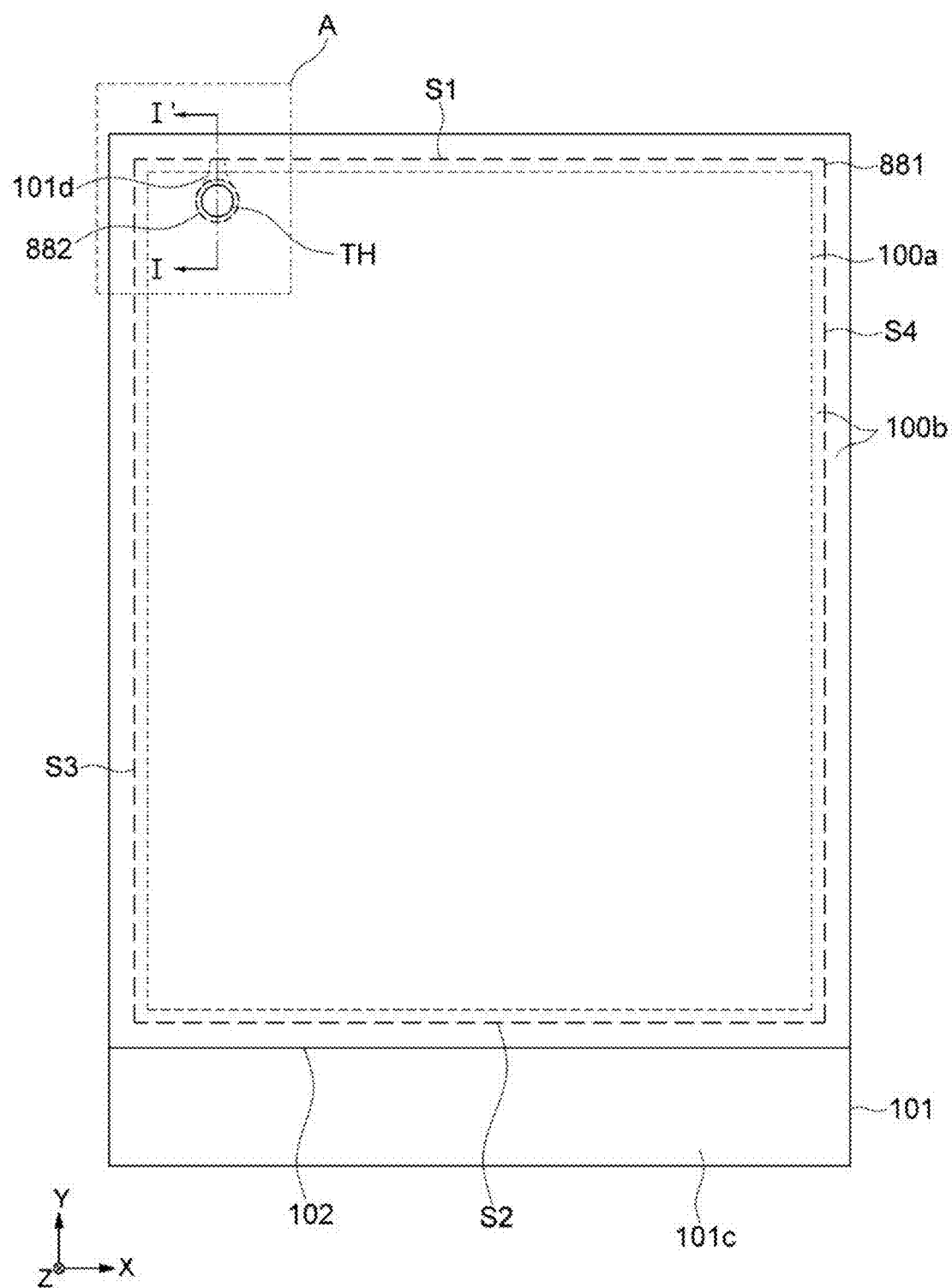
FIG. 3 is a plan view illustrating a display device according to an exemplary embodiment that includes elements of FIG. 1.
Figure 4:
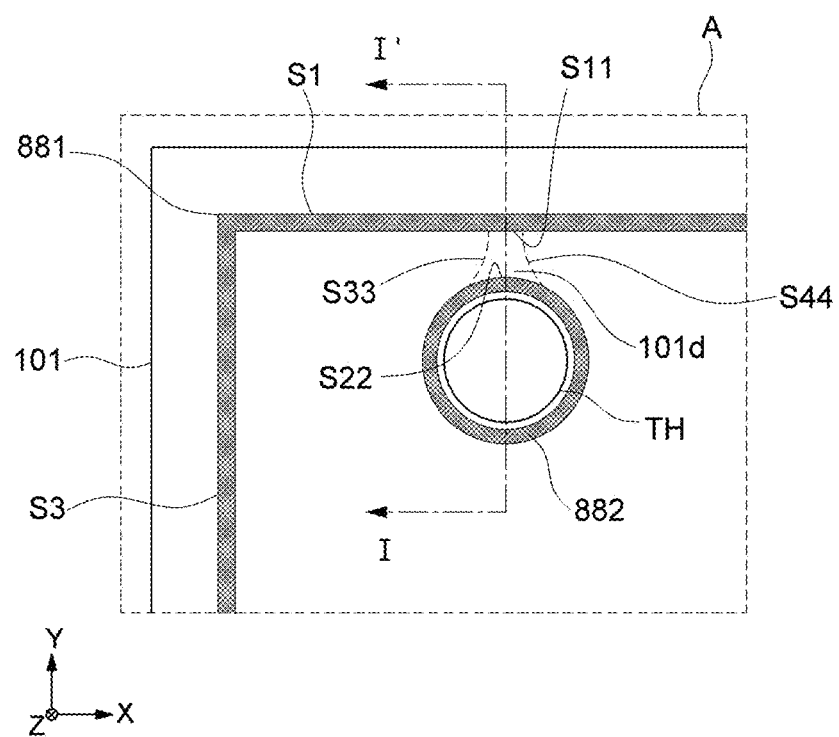
FIG. 4 is an enlarged view of part A of FIG. 3.
Figure 5:
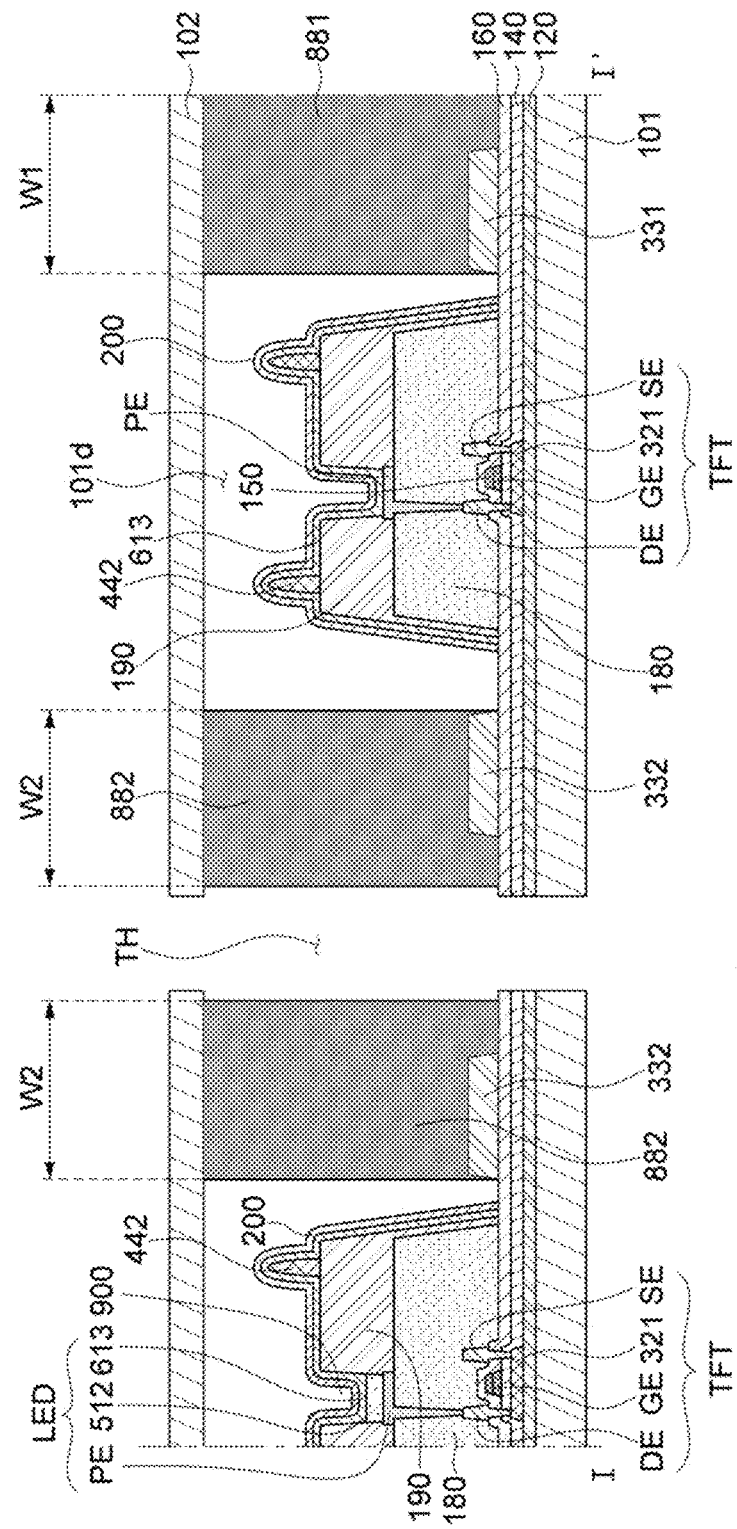
FIG. 5 is a cross-sectional view taken along line I-I' of FIGS. 3 and 4 according to an exemplary embodiment.

FIG. 3 is a plan view illustrating a display device according to an exemplary embodiment that includes elements of FIG. 1. FIG. 4 is an enlarged view of part A of FIG. 3. FIG. 5 is a cross-sectional view taken along line I-I' of FIGS. 3 and 4 according to an exemplary embodiment.

For convenience of illustration, a second substrate 102, which is illustrated in FIG. 3, is omitted in FIG. 4 to allow for a clear description of a first sealing portion 881 and a second sealing portion 882.

Referring to FIGS. 3 to 5, a display device according to an exemplary embodiment includes a first substrate 101, a buffer layer 120, a semiconductor layer 321, a gate insulating layer 140, a gate electrode GE, a first insulating interlayer 150, a second insulating interlayer 160, a source electrode SE, a drain electrode DE, a first heat transfer layer 331, a second heat transfer layer 332, a planarization layer 180, a pixel electrode PE, a pixel defining layer 190, a spacer 442, a light emitting layer 512, a common electrode 613, a capping layer 200, a first sealing portion 881, a second sealing portion 882, and a second substrate 102. The light emitting layer 512 may also be referred to herein as a display element. The pixel defining layer 190 may also be referred to herein as a light blocking layer 190.

The first substrate 101 is substantially the same as the substrate 101 of FIG. 1 described above. The first substrate 101 includes a display area 100a and a non-display area 100b. An area of the first substrate 101 is larger than an area of the second substrate 102. Accordingly, a part of the non-display area 100b of the first substrate 101 does not overlap the second substrate 102. In such an exemplary embodiment, a portion of the non-display area 100b of the first substrate 101 that does not overlap the second substrate 102 is defined as a pad area 101c, and a portion of the non-display area 100b excluding the pad area is defined as a non-pad area. The first substrate 101 may include an organic or plastic material.

The buffer layer 120 is disposed on the first substrate 101. The buffer layer 120 may be disposed over an entire surface of the first substrate 101. For example, the buffer layer 120 may overlap the entire surface of the first substrate 101.

The buffer layer 120 serves to prevent permeation of undesirable elements and to planarize a surface therebelow, and may include suitable materials for planarizing and/or preventing permeation. For example, the buffer layer 120 may include one of a silicon nitride ($SiN_x$) layer, a silicon oxide ($SiO_2$) layer and a silicon oxynitride ($SiO_xN_y$) layer. However, the buffer layer 120 is not limited thereto, and in exemplary embodiments, the buffer layer 120 may be omitted based on the type of the first substrate 101 and process conditions thereof.

The semiconductor layer 321 is disposed on the buffer layer 120. The semiconductor layer 321 includes a channel area, a source area, and a drain area. The semiconductor layer 321 may include, for example, a polycrystalline silicon layer, an amorphous silicon layer, and an oxide semiconductor including, for example, indium gallium zinc oxide (IGZO) or indium zinc tin oxide (IZTO). For example, in a case in which the semiconductor layer 321 includes a polycrystalline silicon layer, the semiconductor layer 321 may include a channel area is not doped with an impurity, and source and drain electrodes respectively disposed on opposite sides of the channel area which are doped with impurity ions.

The gate insulating layer 140 is disposed on the semiconductor layer 321 and the buffer layer 120. The gate insulating layer 140 may include at least one of, for example, tetraethylorthosilicate (TEOS), silicon nitride ($SiN_x$) and silicon oxide ($SiO_2$). For example, the gate insulating layer 140 may have a double-layer structure in which a $SiN_x$ layer having a thickness of about 40 nm and a TEOS layer having a thickness of about 80 nm are sequentially stacked.

The gate electrode GE is disposed on the gate insulating layer 140. For example, the gate electrode GE may be disposed between the gate insulating layer 140 and the insulating interlayer 150. In such an exemplary embodiment, the gate electrode GE overlaps the channel area of the semiconductor layer 321.

In an exemplary embodiment, the gate electrode GE may include, for example, an aluminum-based metal such as aluminum (Al) and an aluminum alloy, or a silver-based metal such as silver (Ag) and a silver alloy, or a copper-based metal such as copper (Cu) and a copper alloy, or a molybdenum-based metal such as molybdenum (Mo) and a molybdenum alloy. In an exemplary embodiment, the gate electrode GE may include one of chromium (Cr) and tantalum (Ta). In an exemplary embodiment, the gate electrode GE may have a multilayer structure that includes two conductive layers having physical properties different from each other.

The scan line and the emission control line are also disposed on the gate insulating layer 140. In an exemplary embodiment, the (n−1)-th scan line SLn−1, the n-th scan line SLn, the (n+1)-th scan line SLn+1, and the emission control line EL may be disposed between the gate insulating layer 140 and the first insulating interlayer 150. The scan line and the emission control line may include a material substantially the same as the material included in the gate electrode.

The first insulating interlayer 150 is disposed on the gate electrode GE and the gate insulating layer 140. The first insulating interlayer 150 may have a thickness greater than a thickness of the gate insulating layer 140. The first insulating interlayer 150 may include a material substantially the same as the material included in the gate insulating layer 140 described above.

The first insulating interlayer 150 is also disposed on each of the scan lines (e.g., SLn−1, SLn, and SLn+1) and each emission control line EL.

In an exemplary embodiment, the storage capacitor Cst in FIG. 2 includes a first capacitor electrode and a second capacitor electrode that face each other, and the second capacitor electrode is located on the first insulating interlayer 150. For example, the second capacitor electrode is located between the first insulating interlayer 150 and the second insulating interlayer 160. The second capacitor electrode defines the storage capacitor Cst along with the gate electrode of the first switching transistor Tr1 (hereinafter referred to as a first gate electrode).

The initialization line IL of FIG. 2 is also disposed on the first insulating interlayer 150. For example, the initialization line IL is disposed between the first insulating interlayer 150 and the second insulating interlayer 160.

The second insulating interlayer 160 is disposed on the second capacitor electrode of the storage capacitor Cst, the initialization line IL, and the first insulating interlayer 150. The second insulating interlayer 160 may have a thickness greater than a thickness of the gate insulating layer 140. The second insulating interlayer 160 may include a material substantially the same as the material included in the gate insulating layer 140 described above.

The source electrode SE, the drain electrode DE, the first heat transfer layer 331 and the second heat transfer layer 332 are disposed on the second insulating interlayer 160.

The source electrode SE is connected to the source area of the semiconductor layer 321 through a source contact hole that is defined through the second insulating interlayer 160, the first insulating interlayer 150, and the gate insulating layer 140.

The drain electrode DE is connected to the drain area of the semiconductor layer 321 through a drain contact hole that is defined through the second insulating interlayer 160, the first insulating interlayer 150, and the gate insulating layer 140.

The source electrode SE may include a refractory metal such as, for example, molybdenum, chromium, tantalum and titanium, or an alloy thereof. The data line DL may have a multilayer structure including a refractory metal layer and a low-resistance conductive layer. Examples of the multilayer structure may include a double-layer structure including a chromium or molybdenum (alloy) lower layer and an aluminum (alloy) upper layer, or a triple-layer structure including a molybdenum (alloy) lower layer, an aluminum (alloy) intermediate layer and a molybdenum (alloy) upper layer. In an exemplary embodiment, the source electrode SE may include any suitable metals or conductors other than the aforementioned materials.

The drain electrode DE may include a material substantially the same as the material included in the source electrode SE described above.

The aforementioned switching element TFT that includes the semiconductor layer 321, the gate electrode GE, the source electrode SE and the drain electrode DE may be one of the first to seventh switching elements T1 to T7 in FIG. 2. In an exemplary embodiment, for example, the switching element TFT may be the sixth switching element T6.

The first heat transfer layer 331 is disposed between the second insulating interlayer 160 and the first sealing portion 881. A laser light is used during a sealing process between the first substrate 101 and the second substrate 102. The laser light is directed to an outer surface of the second substrate 102 located in an area corresponding to the first sealing portion 881. In such an exemplary embodiment, an upper surface of the first sealing portion 881 is melted by heat of the laser light, such that the first sealing portion 881 and the second substrate 102 are attached to each other. In an exemplary embodiment, the heat of the laser light is transmitted to the first heat transfer layer 331 through the first sealing portion 881. By this first heat transfer layer 331, the heat of the laser light may be concentrated to a lower surface of the first sealing portion 881. Accordingly, the lower surface of the first sealing portion 881 is melted, and thus, the first sealing portion 881 and the second insulating interlayer 160 of the first substrate 101 are attached to each other. The first heat transfer layer 331 may improve adhesion between the first sealing portion 881 and the second insulating interlayer 160.

The second heat transfer layer 332 is disposed between the second insulating interlayer 160 and the second sealing portion 882. The second heat transfer layer 332 may include a material substantially the same as the material included in the first heat transfer layer 331 described above. The second heat transfer layer 332 may improve adhesion between the second sealing portion 882 and the second insulating interlayer 160.

Each of the first heat transfer layer 331 and the second heat transfer layer 332 may include a material substantially the same as the material included in the source electrode SE described above.

The data line DL and the high potential line VDL in FIG. 2 are also disposed on the second insulating interlayer 160. The data line DL and the high potential line VDL may include a material substantially the same as the material included in the source electrode SE described above.

The planarization layer 180 is disposed on the source electrode SE, the drain electrode DE, the high potential line VDL, and the data line DL.

The planarization layer 180 serves to eliminate a height difference of a layer therebelow. As a result, a luminous efficiency of the LED to be disposed thereon may be increased. The planarization layer 180 may include at least one of, for example, a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

The LED may be an OLED. The LED includes a light emitting layer 512, an anode electrode PE (hereinafter referred to as a pixel electrode) and a cathode electrode, which corresponds to and is hereinafter referred to as a common electrode 613.

Figure 19:
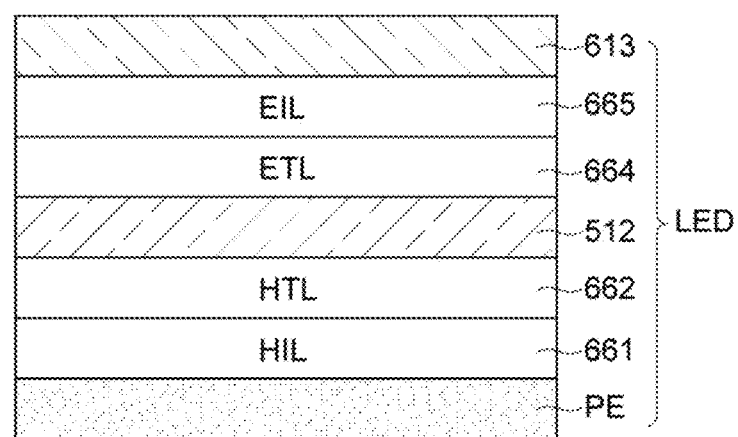
FIG. 19 is a cross-sectional view of a light emitting diode.

The light emitting layer 512 may include a low molecular weight organic material or a high molecular weight organic material. As shown in FIG. 19, at least one of a hole injecting layer 661 and a hole transporting layer 662 may further be disposed between the pixel electrode PE and the light emitting layer 512, and at least one of an electron transporting layer 664 and an electron injecting layer 665 may further be disposed between the light emitting layer 512 and the common electrode 613.

The pixel electrode PE is disposed on the planarization layer 180. A part of or all of the pixel electrode PE is located in a light emission area 900. For example, the pixel electrode PE is located in an area corresponding to the light emission area 900 that is defined by the light blocking layer 190 to be described below. The pixel electrode PE is connected to the drain electrode DE through a pixel contact hole that is defined through the planarization layer 180.

The pixel electrode PE may have a rhombic shape. Alternatively, the pixel electrode PE may have one of various shapes other than the rhombic shape such as, for example, a quadrangular shape.

The light blocking layer 190 is disposed on the pixel electrode PE and the planarization layer 180. The light blocking layer 190 has an opening that is defined through the light blocking layer 190. The opening corresponds to the light emission area 900. The light emission area 900 may have a rhombic shape. Alternatively, the light emission area 900 may have one of various shapes other than the rhombic shape such as, for example, a quadrangular shape. A size of the light emission area 900 may be less than a size of the pixel electrode PE described above. At least a portion of the pixel electrode PE is located in the light emission area 900. In such an exemplary embodiment, the entirety of the light emission area 900 overlaps the pixel electrode PE.

The light blocking layer 190 may include a resin such as, for example, a polyacrylate resin and a polyimide resin.

The spacer 442 is disposed on the light blocking layer 190. The spacer 442 may include a material substantially the same as the material included in the light blocking layer 190. The spacer 442 serves to minimize or reduce a height difference between a layer located in the display area 100a of the first substrate 101 and a layer located in the non-display area 100b of the first substrate 101.

The pixel electrode PE and the common electrode 613 may be formed as one of a transmissive electrode, a transflective electrode and a reflective electrode.

In an exemplary embodiment, the transmissive electrode may include transparent conductive oxide (TCO). Such TCO may include at least one of, for example, indium tin oxide (ITO), indium zinc oxide (IZO), antimony tin oxide (ATO), aluminum zinc oxide (AZO), zinc oxide (ZnO), and mixtures thereof.

In an exemplary embodiment, the transflective electrode and the reflective electrode may include a metal such as, for example, magnesium (Mg), silver (Ag), gold (Au), calcium (Ca), lithium (Li), chromium (Cr), aluminum (Al) and copper (Cu), or an alloy thereof. In such an exemplary embodiment, whether an electrode is a transflective type or a reflective type depends on the thickness of the electrode. Typically, the transflective electrode has a thickness of about 200 nm or less, and the reflective electrode has a thickness of about 300 nm or more. As the thickness of the transflective electrode decreases, light transmittance and resistance increase. Alternatively, as the thickness of the transflective electrode increases, light transmittance decreases.

In such an exemplary embodiment, the transflective electrode and the reflective electrode may have a multilayer structure that includes a metal layer including a metal or a metal alloy and a TCO layer stacked on the metal layer.

The capping layer 200 is disposed on the common electrode 613. For example, the capping layer 200 is disposed between the common electrode 613 and the second substrate 102. The capping layer 200 may include a material substantially the same as the material included in the first insulating interlayer 150.

The second substrate 102 is disposed on the capping layer 200. The second substrate 102 may include glass or plastic. An area of the second substrate 102 is less than an area of the first substrate 101.

As illustrated in FIG. 5, the first sealing portion 881 is disposed between the first substrate 101 and the second substrate 102. For example, the first sealing portion 881 is disposed between an edge of the non-pad area of the first substrate 101 and an edge of the second substrate 102. The first sealing portion 881 has a closed loop shape. For example, the first sealing portion 881 may have a closed loop shape that encloses the display area 100a, the scan driver 111, and the emission control driver 112.

In an exemplary embodiment, the data driver 113 is disposed in the pad area 101c outside of the first sealing portion 881.

As illustrated in FIG. 3, the first sealing portion 881 may have a quadrangular shape (e.g., a rectangular shape). For example, the first sealing portion 881 may have a rectangular shape in which two sides S3 and S4 that face each other in the X-axis direction are longer than two sides S1 and S2 that face each other in the Y-axis direction.

Herein, when an element has a plurality of sides, some of the sides may be referred to as short sides and some of the sides may be referred to as long sides. It is to be understood that the short sides and the long sides are described relative to each other. For example, the short sides are shorter than the long sides, and the long sides are longer than the short sides.

A lower surface of the first sealing portion 881 contacts the second insulating interlayer 160 on the first substrate 101, and an upper surface of the first sealing portion 881 contacts the second substrate 102.

A through hole TH is located in the display area 100a of the first substrate. The through hole TH is defined through the first substrate 101, the second substrate 102, and elements disposed between the first substrate 101 and the second substrate 102 along a direction in which the first substrate 101 and the second substrate 102 face each other. For example, the through hole TH is defined through the first substrate 101, the second substrate 102, and elements disposed between the first substrate 101 and the second substrate 102 along a Z-axis direction. The Z-axis direction may also be referred to as a thickness direction of the display device 1000. Thus, as shown in FIG. 5, in an exemplary embodiment, the second substrate 102 faces the first substrate 101 in a thickness direction of the display device 1000, and the through hole TH is defined through the first substrate 101 and the second substrate 102 along the thickness direction.

The second sealing portion 882 is disposed between the first substrate 101 and the second substrate 102. The second sealing portion 882 is disposed in the display area 100a. The second sealing portion 882 is enclosed by the first sealing portion 881. The second sealing portion 882 has a closed loop shape that encloses (e.g., entirely encloses) the through hole TH. The second sealing portion 882 defines a center portion of the through hole TH. For example, a space enclosed by the second sealing portion 882 is the center portion of the through hole TH.

As illustrated in FIGS. 3 and 4, the second sealing portion 882 may have a circular shape.

As illustrated in FIG. 5, in an exemplary embodiment, a width W1 of the first sealing portion 881 may be about equal to a width W2 of the second sealing portion 882. Alternatively, in an exemplary embodiment, the width W2 of the second sealing portion 882 may be less than the width W1 of the first sealing portion 881. When the width W2 of the second sealing portion 882 is less than the width W1 of the first sealing portion 881, reduction of a planar area of the display area 100a due to the second sealing portion 882 in the display area 100a may be significantly reduced or minimized.

The first sealing portion 881 may include an adhesive, a glass, or a curable resin composition. The second sealing portion 882 may include a material substantially the same as the material included in the first sealing portion 881.

As illustrated in FIGS. 4 and 5, a dummy area 101d is located above the first substrate 101 between the second sealing portion 882 and the first sealing portion 881. For example, the dummy area 101d is located between the second sealing portion 882 and one side of the first sealing portion 881. For example, in an exemplary embodiment, of first, second, third, and fourth sides S1, S2, S3, and S4 of the first sealing portion 881, the first side S1 is located closest to the second sealing portion 882, and the dummy area 101d is located between the first side S1 and the second sealing portion 882. In such an exemplary embodiment, a distance between one side of the first sealing portion 881 and the second sealing portion 882 refers to a length of a perpendicular line that connects the one side of the first sealing portion 881 and a center point of the second sealing portion 882 (or a center point of the through hole TH).

A part of the dummy area 101d may be located in the display area 100a of the first substrate 101, and another part of the dummy area 101d may be located in the non-display area 100b of the first substrate 101.

In an exemplary embodiment, when, of the first, second, third, and fourth sides S1, S2, S3, and S4 of the first sealing portion 881, two different sides (e.g., the first and third sides S1 and S3) are located at a same distance from the second sealing portion 882 and are located closer to the second sealing portion 882 than other two sides (e.g., the second and fourth sides S2 and S4) are to the second sealing portion 882, the dummy area 101d may be located between one of the two different sides (e.g., the first and third sides S1 and S3) and the second sealing portion 882.

Herein, the terms "first," "second," "third," etc. are used to distinguish one element from another, and the elements are not limited by these terms. Thus, a "first" element in an exemplary embodiment may be described as a "second" element in another exemplary embodiment.

As illustrated in FIG. 4, the dummy area 101d may have a polygonal shape including first, second, third, and fourth sides S11, S22, S33, and S44. In such an exemplary embodiment, the first side S11 of the dummy area 101d refers to an interface between the dummy area 101d and the first side S1 of the first sealing portion 881, and the second side S22 of the dummy area 101d refers to an interface between the dummy area 101d and the second sealing portion 882.

The third and fourth sides S33 and S44 of the dummy area 101d disposed along a direction in which long sides (e.g., the third and fourth sides S3 and S4) of the first sealing portion 881 face each other may each have a curved line shape. For example, each of the third and fourth sides S33 and S44 of the dummy area 101d that face each other in the X-axis direction may have a curved line shape. A length of the third side S33 of the dummy area 101d and a length of the fourth side S44 of the dummy area 101d may be about equal to each other.

A curvature of the third side S33 of the dummy area 101d and a curvature of the fourth side S44 of the dummy area 101d may be about equal to each other. In addition, a curvature of the second sealing portion 882 may be about equal to or less than the curvature of the third side S33 (or the fourth side 44) of the dummy area 101d.

The third side S33 of the dummy area 101d and the fourth side S44 of the dummy area 101d may have a symmetrical shape with each other. For example, the third side S33 and the fourth side S44 may have a symmetrical shape with respect to an extending direction of the data line DL (e.g., the Y-axis direction). For example, the third side S33 and the fourth side S44 may have a symmetrical shape with respect to the extending direction of the data line DL (e.g., the Y-axis direction) that passes through the center point of the second sealing portion 882 (or the center point of the through hole TH).

When one side S1 of the first sealing portion 881 disposed closest to the second sealing portion 882 is defined as a reference side S1, a distance between the third side S33 and the fourth side S44 may gradually increase along a direction from the reference side S1 toward the second sealing portion 882 (e.g., a direction opposite to the Y-axis direction).

The first and second sides S11 and S22 of the dummy area 101d disposed along a direction in which short sides (e.g., the first and second sides S1 and S2) of the first sealing portion 881 face each other may have a straight line shape and a curved shape, respectively. For example, one of the first and second sides S11 and S22 of the dummy area 101d that face each other in the Y-axis direction, e.g., the first side S11, may have a straight line shape, and the other side thereof, e.g., the second side S22, may have a curved line shape. For example, of the first and second sides S11 and S22 of the dummy area 101d that face each other in the Y-axis direction, the first side S11 adjacent to the first sealing portion 881 may have a straight line shape, and the second side S22 adjacent to the second sealing portion 882 may have a curved line shape. In an exemplary embodiment, the first side S11 adjacent to the first sealing portion 881 contacts the first sealing portion 881, and the second side S22 adjacent to the second sealing portion 882 contacts the second sealing portion 882. For example, in an exemplary embodiment, the shape of the first side S11 may correspond to the shape of the first sealing portion 881 in an area that the first side S11 contacts the first sealing portion 881, and the shape of the second side S22 may correspond to the shape of the second sealing portion 882 in an area that the second side S22 contacts the second sealing portion 882.

A length of the second side S22 of the dummy area 101d is greater than a length of the first side S11 of the dummy area 101d.

The buffer layer 120, the semiconductor layer 321, the gate insulating layer 140, the gate electrode GE, the first insulating interlayer 150, the second insulating interlayer 160, the source electrode SE, the drain electrode DE, the planarization layer 180, the pixel electrode PE, the pixel defining layer 190, the spacer 442, the common electrode 613, the capping layer 200, and the second substrate 102 may be disposed above the dummy area 101d of the first substrate 101. For example, the buffer layer 120, the semiconductor layer 321, the gate insulating layer 140, the gate electrode GE, the first insulating interlayer 150, the second insulating interlayer 160, the source electrode SE, the drain electrode DE, the planarization layer 180, the pixel electrode PE, the pixel defining layer 190, the spacer 442, the common electrode 613, and the capping layer 200 may be disposed between the first substrate 101 and the second substrate 102 corresponding to the dummy area 101d.

For example, the light emitting layer 512 is not disposed in the dummy area 101d of the first substrate 101. In addition, the hole injecting layer 661, the hole transporting layer 662, the electron transporting layer 664, and the electron injecting layer 665 described above are not disposed in the dummy area 101d of the first substrate 101. For example, in an exemplary embodiment, the light emitting layer 512, the hole injecting layer 661, the hole transporting layer 662, the electron transporting layer 664, and the electron injecting layer 665 are selectively disposed only in the display area 100a from among the display area 100a and the dummy area 101d of the first substrate 101.

The light emitting layer 512, the hole injecting layer 661, the hole transporting layer 662, the electron transporting layer 664, and the electron injecting layer 665 are formed before the first sealing portion 881 and the second sealing portion 882 are formed. In such an exemplary embodiment, the light emitting layer 512, the hole injecting layer 661, the hole transporting layer 662, the electron transporting layer 664, and the electron injecting layer 665 are selectively deposited in the light emission area 900 of the display area 100a using a mask having a plurality of pattern holes. The pattern holes of the mask are aligned corresponding to the plurality of light emission areas 900.

In an exemplary embodiment, the pattern holes are not located at a portion of the mask corresponding to an area in which the first sealing portion 881 is to be formed (hereinafter referred to as a first sealing area) and an area in which the second sealing portion 882 is to be formed (hereinafter referred to as a second sealing area). In such an exemplary embodiment, a portion of the mask corresponding to the first sealing area will be defined as a first mask portion, and a portion of the mask corresponding to the second sealing area will be defined as a second mask portion. The second mask portion is connected to the first mask portion, which may prevent sagging of the second mask portion, and the second mask portion and the first mask portion are connected by a dummy mask portion that is disposed therebetween. In such an exemplary embodiment, the dummy mask portion is located corresponding to the dummy area 101d described above. In an exemplary embodiment, the pattern holes are not located at the dummy mask portion. This is because if the pattern holes are located at the dummy mask portion, a support force of the dummy mask portion may be diminished, and the dummy mask portion and the second mask portion may sag downwardly. For this reason, in an exemplary embodiment, pattern holes are not located at the dummy mask portion. Accordingly, in an exemplary embodiment, the light emitting layer 512, the hole injecting layer 661, the hole transporting layer 662, the electron transporting layer 664 and the electron injecting layer 665 described above, are not formed in the dummy area 101d.

Figure 6:
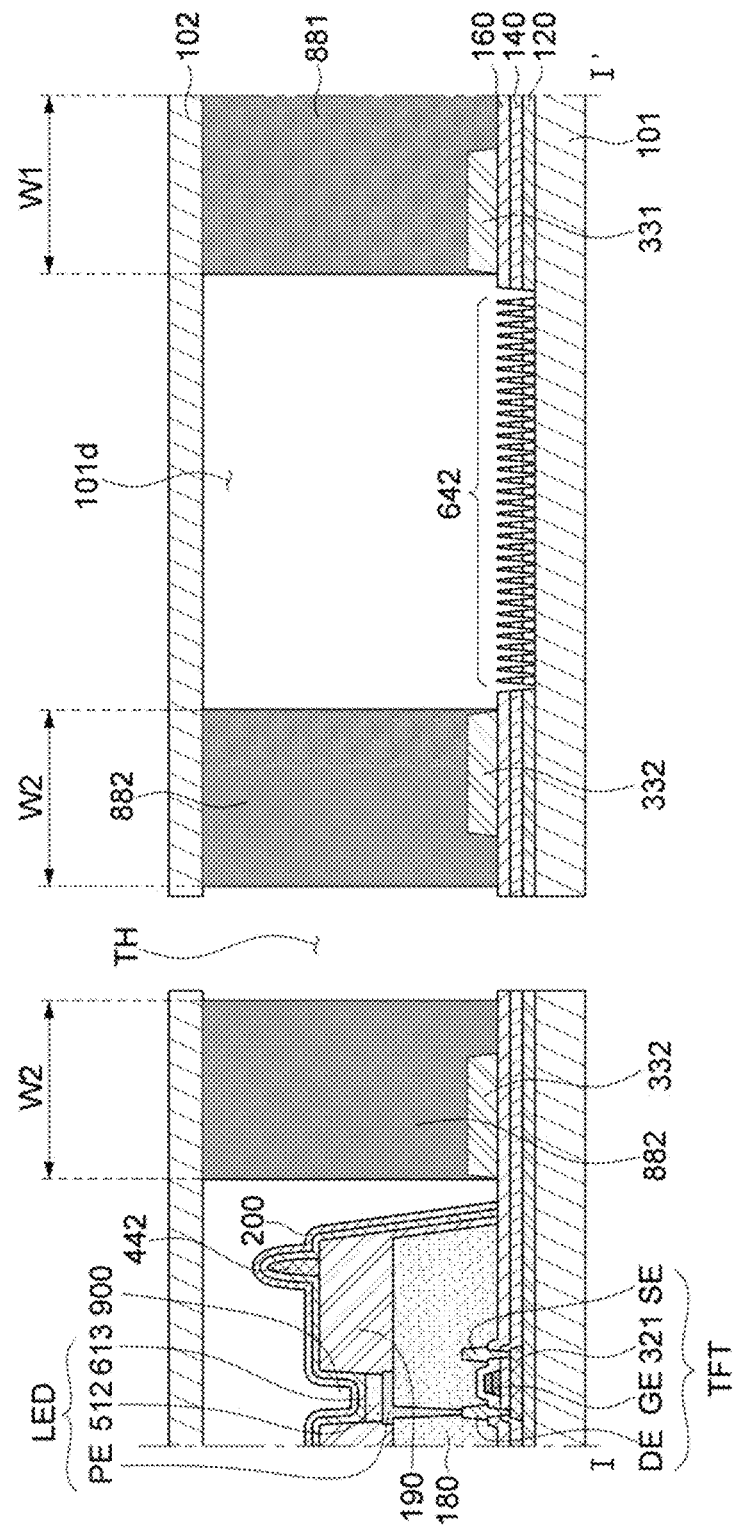
FIG. 6 is a cross-sectional view taken along line I-I' of FIGS. 3 and 4 according to an exemplary embodiment.

FIG. 6 is a cross-sectional view taken along line I-I' of FIGS. 3 and 4 according to an exemplary embodiment.

In an exemplary embodiment, as illustrated in FIG. 6, a buffer layer 120, a gate insulating layer 140, a second insulating interlayer 160, and a second substrate 102 may be disposed above a dummy area 101d of a first substrate 101. For example, the buffer layer 120, the gate insulating layer 140, and the second insulating interlayer 160 may be disposed between the first substrate 101 and the second substrate 102 corresponding to the dummy area 101d.

An insulating layer 642 that includes the buffer layer 120, the gate insulating layer 140 and the second insulating interlayer 160 has a concavo-convex shape, for example, as illustrated in FIG. 6.

For example, in an exemplary embodiment, a light emitting layer 512 is not disposed in the dummy area 101d of the first substrate 101. In addition, a hole injecting layer 661, a hole transporting layer 662, an electron transporting layer 664, and an electron injecting layer 665, as described above, are not disposed in the dummy area 101d of the first substrate 101.

Figure 7:
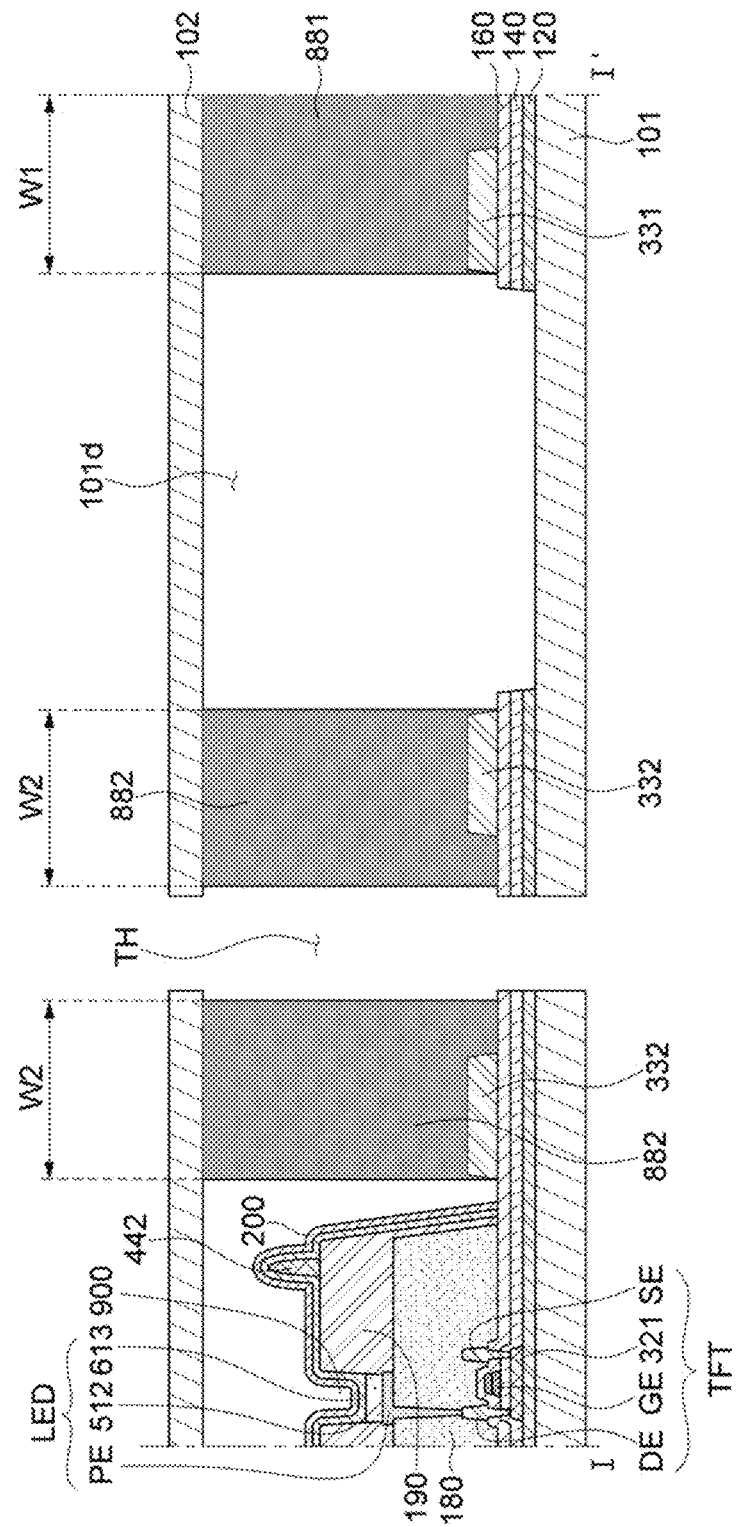
FIG. 7 is a cross-sectional view taken along line I-I' of FIGS. 3 and 4 according to an exemplary embodiment.

FIG. 7 is a cross-sectional view taken along line I-I' of FIGS. 3 and 4 according to an exemplary embodiment.

In an exemplary embodiment, as illustrated in FIG. 7, a second substrate 102 is disposed above a dummy area 101d of a first substrate 101. For example, in an exemplary embodiment, no components are disposed between the first substrate 101 and the second substrate 102 corresponding to the dummy area 101d.

For example, in an exemplary embodiment, a light emitting layer 512 is not disposed in the dummy area 101d of the first substrate 101. In addition, a hole injecting layer 661, a hole transporting layer 662, an electron transporting layer 664, and an electron injecting layer 665, as described above, are not disposed in the dummy area 101d of the first substrate 101.

Figure 8:
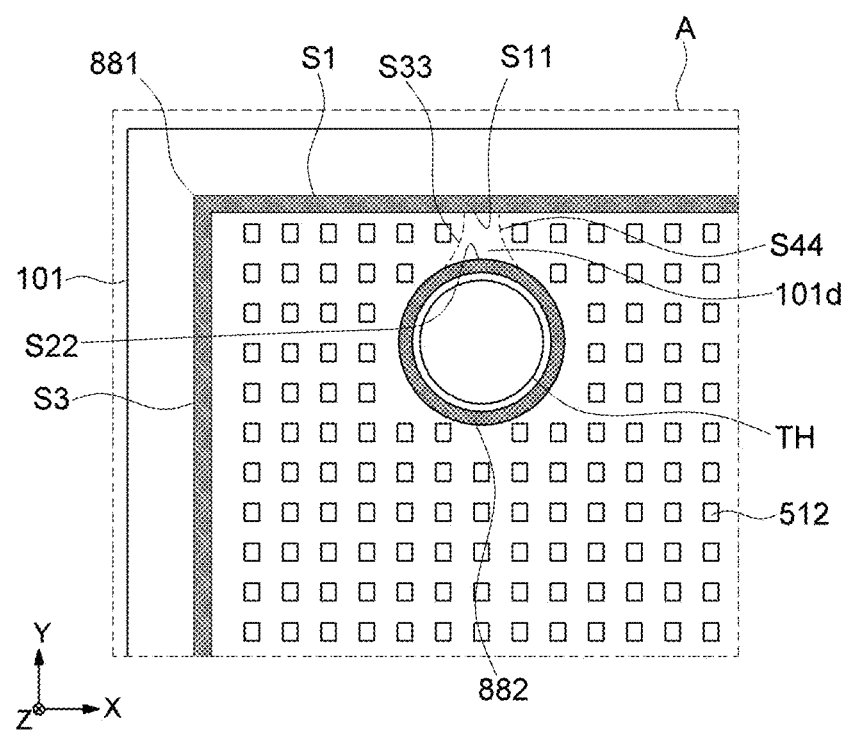
FIG. 8 illustrates an arrangement of a light emitting layer of a first substrate of FIG. 3.

FIG. 8 illustrates an arrangement of the light emitting layer 512 of the first substrate 101 of FIG. 3.

As illustrated in FIG. 8, in an exemplary embodiment, the light emitting layer 512 is disposed in the display area 100a of the first substrate 101. However, the light emitting layer 512 is not disposed in the dummy area 101d of the first substrate 101. In addition, the light emitting layer 512 is not disposed at the first sealing portion 881, the second sealing portion 882, and the through hole TH.

The through hole TH may be defined as the first and second substrates 101 and 102 that are bonded to each other by the first and second sealing portions 881 and 882 are irradiated with a laser light. The laser light is incident to the bonded substrate, e.g., the first and second substrates 101 and 102, enclosed by the second sealing portion 882. For example, as the laser light penetrates through the bonded substrate, the through hole TH is defined.

In an exemplary embodiment, if an organic material, e.g., the light emitting layer 512, is present in an area corresponding to the through hole TH, an outgas may be generated from the light emitting layer 512 by irradiation of the laser light. The outgas may damage the light emitting layer of surrounding pixels. Accordingly, an organic material, e.g., the light emitting layer 512, the hole injecting layer 661, the hole transporting layer 662, the electron transporting layer 664, and the electron injecting layer 665, is not formed at a portion of the first substrate 101 corresponding to the through hole TH.

Figure 9:
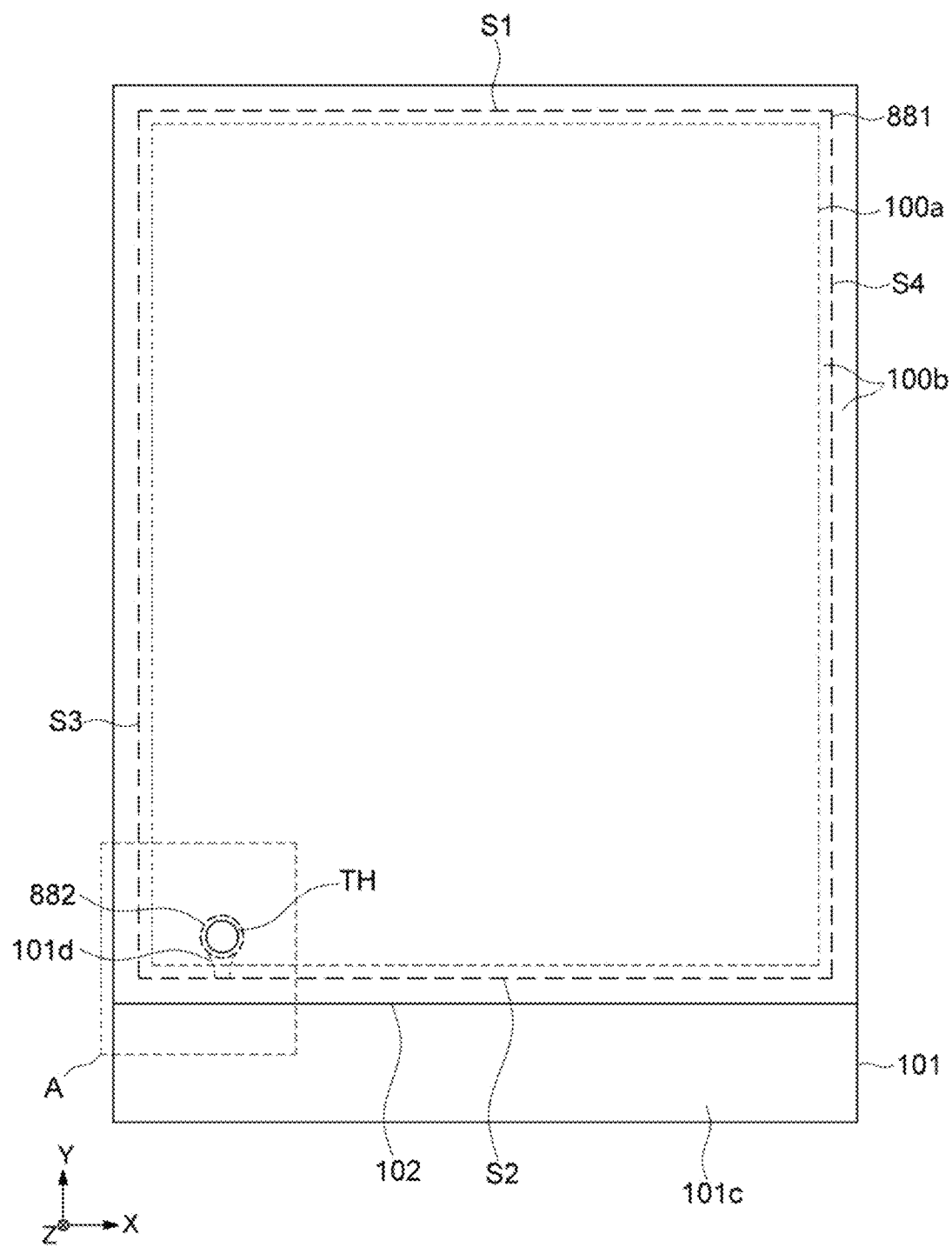
FIG. 9 is a plan view illustrating a display device according to an exemplary embodiment that includes elements of FIG. 1.
Figure 10:
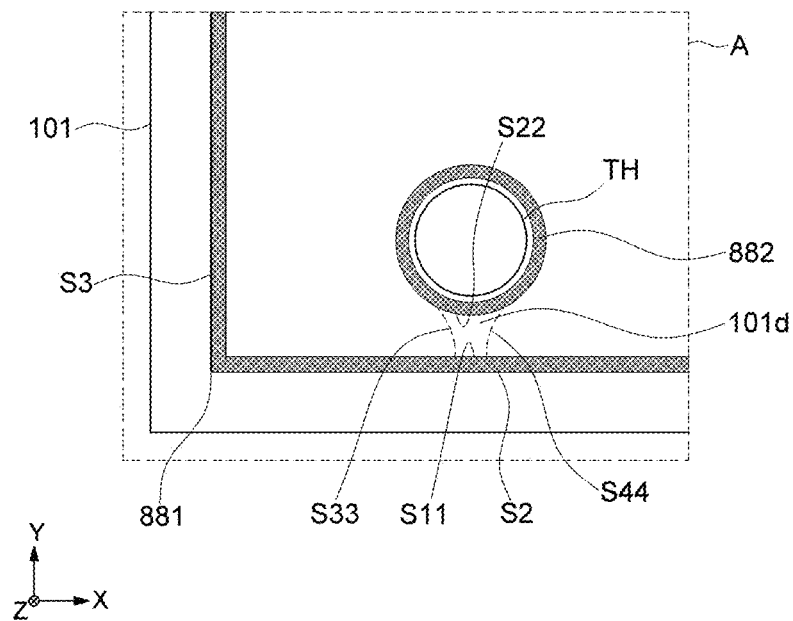
FIG. 10 is an enlarged view of part A of FIG. 9.

FIG. 9 is a plan view illustrating a display device according to an exemplary embodiment that includes elements of FIG. 1. FIG. 10 is an enlarged view of part A of FIG. 9. For convenience of illustration, a second substrate 102 is omitted in FIG. 10 to allow for a clear description of forms of a first sealing portion 881 and a second sealing portion 882.

As illustrated in FIGS. 9 and 10, the second sealing portion 882 may be disposed close to a pad area 101c of a first substrate 101.

As illustrated in FIGS. 9 and 10, a dummy area 101*d* is located above the first substrate 101 between the second sealing portion 882 and the first sealing portion 881. For example, the dummy area 101*d* is located between the second sealing portion 882 and one side of the first sealing portion 881. For example, of first, second, third, and fourth sides S1, S2, S3, and S4 of the first sealing portion 881, the second side S2 is located closest to the second sealing portion 882, and the dummy area 101*d* is located between the second side S2 and the second sealing portion 882. The dummy area 101*d* is substantially the same as the dummy area 101*d* of FIG. 4 described above.

Figure 11:
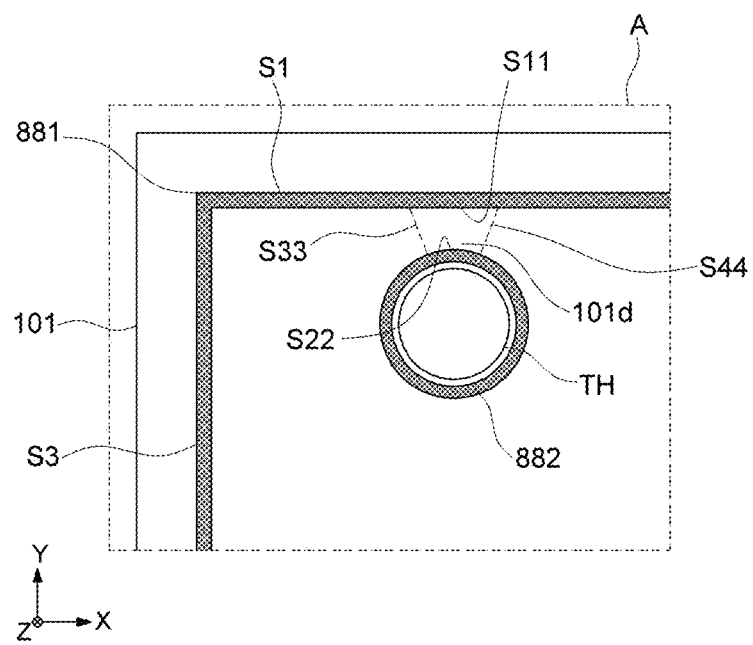
FIG. 11 is a view illustrating a dummy area according to an exemplary embodiment.

FIG. 11 is a view illustrating a dummy area 101*d* according to an exemplary embodiment.

As illustrated in FIG. 11, a dummy area 101*d* may have a polygonal shape including first, second, third, and fourth sides S11, S22, S33, and S44. In such an exemplary embodiment, the first side S11 of the dummy area 101*d* refers to an interface between the dummy area 101*d* and a first side of a first sealing portion 881, and the second side S22 of the dummy area 101*d* refers to an interface between the dummy area 101*d* and a second sealing portion 882.

The third and fourth sides S33 and S44 of the dummy area 101*d* disposed along a direction in which long sides (e.g., third and fourth sides S3 and S4) of the first sealing portion 881 face each other may each have a straight line shape. For example, each of the third and fourth sides S33 and S44 of the dummy area 101*d* that face each other in the X-axis direction may have a straight line shape. A length of the third side S33 of the dummy area 101*d* and a length of the fourth side S44 of the dummy area 101*d* may be about equal to each other.

The third side S33 of the dummy area 101*d* and the fourth side S44 of the dummy area 101*d* may have a symmetrical shape with each other. For example, the third side S33 and the fourth side S44 may have a symmetrical shape with respect to an extending direction of a data line DL (e.g., the Y-axis direction). For example, the third side S33 and the fourth side S44 may have a symmetrical shape with respect to the extending direction of the data line DL (e.g., the Y-axis direction) that passes through a center point of the second sealing portion 882 (or a center point of a through hole TH).

When one side S1 of the first sealing portion 881 disposed closest to the second sealing portion 882 is defined as a reference side S1, a distance between the third side S33 and the fourth side S44 may gradually decrease along a direction from the reference side S1 toward the second sealing portion 882 (e.g., a direction opposite to the Y-axis direction).

The first and second sides S11 and S22 of the dummy area 101*d* disposed along a direction in which short sides (e.g., first and second sides S1 and S2) of the first sealing portion 881 face each other may have a straight line shape and a curved shape, respectively. For example, one of the first and second sides S11 and S22 of the dummy area 101*d* that face each other in the Y-axis direction, e.g., the first side S11, may have a straight line shape, and the other side thereof, e.g., the second side S22, may have a curved line shape. For example, of the first and second sides S11 and S22 of the dummy area 101*d* that face each other in the Y-axis direction, the first side S11 adjacent to the first sealing portion 881 may have a straight line shape, and the second side S22 adjacent to the second sealing portion 882 may have a curved line shape.

A length of the first side S11 of the dummy area 101*d* may be greater than a length of the second side S22 of the dummy area 101*d*. In an exemplary embodiment, when a distance between the third side S33 and the fourth side S44 gradually increases along the direction opposite to the Y-axis direction, the length of the second side S22 may be greater than the length of the first side S11 of the dummy area 101*d*.

Figure 12:
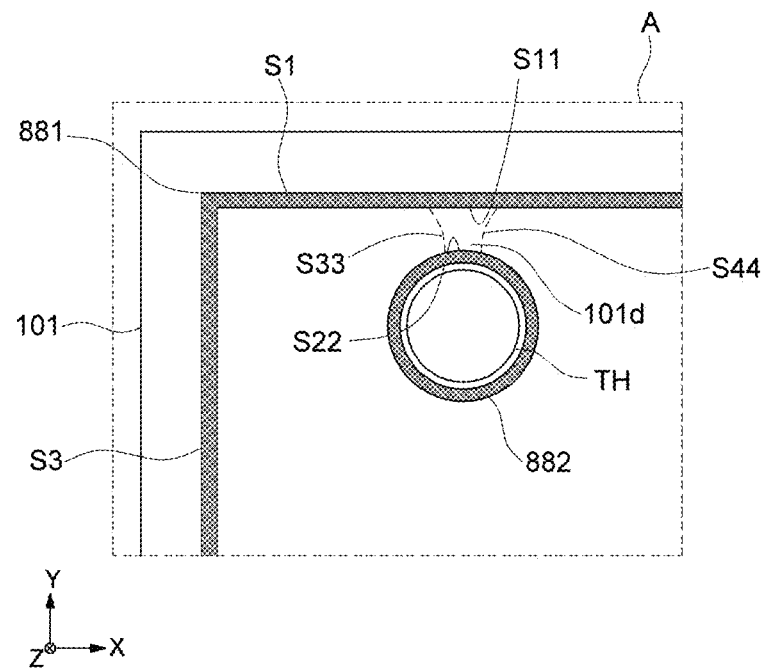
FIG. 12 is a view illustrating a dummy area according to an exemplary embodiment.

FIG. 12 is a view illustrating a dummy area 101*d* according to an exemplary embodiment.

As illustrated in FIG. 12, a dummy area 101*d* may have a polygonal shape including first, second, third, and fourth sides S11, S22, S33, and S44. In such an exemplary embodiment, the first side S11 of the dummy area 101*d* refers to an interface between the dummy area 101*d* and a first side S1 of a first sealing portion 881, and the second side S22 of the dummy area 101*d* refers to an interface between the dummy area 101*d* and a second sealing portion 882.

The third and fourth sides S33 and S44 of the dummy area 101*d* disposed along a direction in which long sides (e.g., third and fourth sides S3 and S4) of the first sealing portion 881 face each other may each have a curved line shape. For example, each of the third and fourth sides S33 and S44 of the dummy area 101*d* that face each other in the X-axis direction may have a curved line shape. A length of the third side S33 of the dummy area 101*d* and a length of the fourth side S44 of the dummy area 101*d* may be about equal to each other.

A curvature of the third side S33 of the dummy area 101*d* and a curvature of the fourth side S44 of the dummy area 101*d* may be about equal to each other. In addition, a curvature of the second sealing portion 882 may be about equal to or less than the curvature of the third side S33 (or the fourth side 44) of the dummy area 101*d*.

The third side S33 of the dummy area 101*d* and the fourth side S44 of the dummy area 101*d* may have a symmetrical shape with each other. For example, the third side S33 and the fourth side S44 may have a symmetrical shape with respect to an extending direction of a data line DL (e.g., the Y-axis direction). For example, the third side S33 and the fourth side S44 may have a symmetrical shape with respect to the extending direction of the data line DL (e.g., the Y-axis direction) that passes through a center point of the second sealing portion 882 (or a center point of a through hole TH).

When one side S1 of the first sealing portion 881 disposed closest to the second sealing portion 882 is defined as a reference side S1, a distance between the third side S33 and the fourth side S44 may gradually decrease along a direction from the reference side S1 toward the second sealing portion 882 (e.g., a direction opposite to the Y-axis direction).

The first and second sides S11 and S22 of the dummy area 101*d* disposed along a direction in which short sides (e.g., first and second sides S1 and S2) of the first sealing portion 881 face each other may have a straight line shape and a curved shape, respectively. For example, one of the first and second sides S11 and S22 of the dummy area 101*d* that face each other in the Y-axis direction, e.g., the first side S11, may have a straight line shape, and the other side thereof, e.g., the second side S22, may have a curved line shape. For example, of the first and second sides S11 and S22 of the dummy area 101*d* that face each other in the Y-axis direction, the first side S11 adjacent to the first sealing portion 881 may have a straight line shape, and the second side S22 adjacent to the second sealing portion 882 may have a curved line shape.

A length of the second side S22 of the dummy area 101*d* is less than a length of the first side S11 of the dummy area 101*d*.

Figure 13:
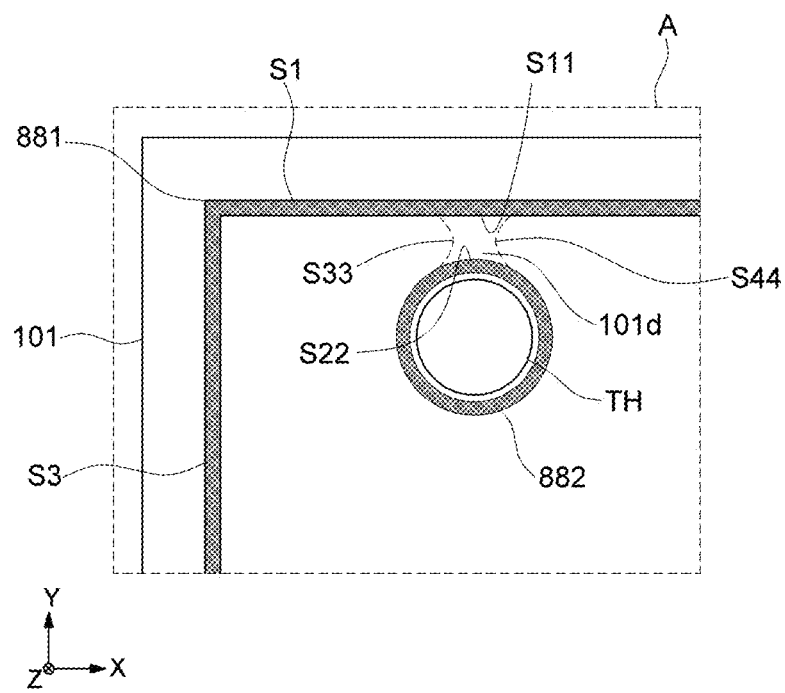
FIG. 13 is a view illustrating a dummy area according to an exemplary embodiment.

FIG. 13 is a view illustrating a dummy area 101*d* according to an exemplary embodiment.

As illustrated in FIG. 13, a dummy area 101*d* may have a polygonal shape including first, second, third, and fourth sides S11, S22, S33, and S44. In such an exemplary embodiment, the first side S11 of the dummy area 101*d* refers to an interface between the dummy area 101*d* and a first side S1 of a first sealing portion 881, and the second side S22 of the dummy area 101*d* refers to an interface between the dummy area 101*d* and a second sealing portion 882.

The third and fourth sides S33 and S44 of the dummy area 101*d* disposed along a direction in which long sides (e.g., third and fourth sides S3 and S4) of the first sealing portion 881 face each other may each have a curved line shape. For example, each of the third and fourth sides S33 and S44 of the dummy area 101*d* that face each other in the X-axis direction may have a curved line shape. A length of the third side S33 of the dummy area 101*d* and a length of the fourth side S44 of the dummy area 101*d* may be about equal to each other.

A curvature of the third side S33 of the dummy area 101*d* and a curvature of the fourth side S44 of the dummy area 101*d* may be about equal to each other. In addition, a curvature of the second sealing portion 882 may be about equal to or less than the curvature of the third side S33 (or the fourth side 44) of the dummy area 101*d*.

The third side S33 of the dummy area 101*d* and the fourth side S44 of the dummy area 101*d* may have a symmetrical shape with each other. For example, the third side S33 and the fourth side S44 may have a symmetrical shape with respect to an extending direction of a data line DL (e.g., the Y-axis direction). For example, the third side S33 and the fourth side S44 may have a symmetrical shape with respect to the extending direction of the data line DL (e.g., the Y-axis direction) that passes through a center point of the second sealing portion 882 (or a center point of a through hole TH).

When one side S1 of the first sealing portion 881 that is disposed closest to the second sealing portion 882 is defined as a first reference side S1, one side S22 of the second sealing portion 882 that faces the first reference side S1 is defined as a second reference side S22, and a virtual line that connects a center point of the third side S33 and a center point of the fourth side S44 is defined as a center line, a distance between the third side S33 and the fourth side S44 gradually decreases along a direction from the first reference side S1 toward the center line (e.g., a direction opposite to the Y-axis direction), and a distance between the third side S33 and the fourth side S44 gradually decreases along a direction from the second reference side S22 toward the center line (e.g., the Y-axis direction). Accordingly, the third side 33 and the fourth side 44 may have a concave lens shape. For example, the third side S33 may have a shape of "),", and the fourth side S44 may have a shape of "(."

The first and second sides S11 and S22 of the dummy area 101*d* disposed along a direction in which short sides (e.g., first and second sides S1 and S2) of the first sealing portion 881 face each other may have a straight line shape and a curved shape, respectively. For example, one of the first and second sides S11 and S22 of the dummy area 101*d* that face each other in the Y-axis direction, e.g., the first side S11, may have a straight line shape, and the other side thereof, e.g., the second side S22, may have a curved line shape. For example, of the first and second sides S11 and S22 of the dummy area 101*d* that face each other in the Y-axis direction, the first side S11 adjacent to the first sealing portion 881 may have a straight line shape, and the second side S22 adjacent to the second sealing portion 882 may have a curved line shape.

A length of the second side S22 of the dummy area 101*d* is greater than a length of the first side S11 of the dummy area 101*d*.

Figure 14:
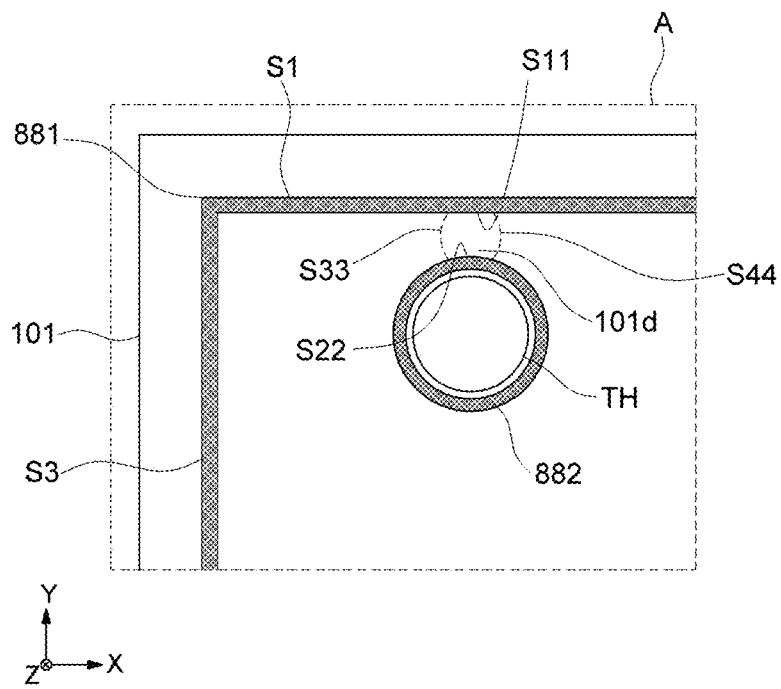
FIG. 14 is a view illustrating a dummy area according to an exemplary embodiment.

FIG. 14 is a view illustrating a dummy area 101*d* according to an exemplary embodiment.

As illustrated in FIG. 14, a dummy area 101*d* may have a polygonal shape including first, second, third, and fourth sides S11, S22, S33, and S44. In such an exemplary embodiment, the first side S11 of the dummy area 101*d* refers to an interface between the dummy area 101*d* and a first side S1 of a first sealing portion 881, and the second side S22 of the dummy area 101*d* refers to an interface between the dummy area 101*d* and a second sealing portion 882.

The third and fourth sides S33 and S44 of the dummy area 101*d* disposed along a direction in which long sides (e.g., third and fourth sides S3 and S4) of the first sealing portion 881 face each other may each have a curved line shape. For example, each of the third and fourth sides S33 and S44 of the dummy area 101*d* that face each other in the X-axis direction may have a curved line shape. A length of the third side S33 of the dummy area 101*d* and a length of the fourth side S44 of the dummy area 101*d* may be about equal to each other.

A curvature of the third side S33 of the dummy area 101*d* and a curvature of the fourth side S44 of the dummy area 101*d* may be about equal to each other. In addition, a curvature of the second sealing portion 882 may be about equal to or less than the curvature of the third side S33 (or the fourth side 44) of the dummy area 101*d*.

The third side S33 of the dummy area 101*d* and the fourth side S44 of the dummy area 101*d* may have a symmetrical shape with each other. For example, the third side S33 and the fourth side S44 may have a symmetrical shape with respect to an extending direction of a data line DL (e.g., the Y-axis direction). For example, the third side S33 and the fourth side S44 may have a symmetrical shape with respect to the extending direction of the data line DL (e.g., the Y-axis direction) that passes through a center point of the second sealing portion 882 (or a center point of a through hole TH).

When one side S1 of the first sealing portion 881 that is disposed closest to the second sealing portion 882 is defined as a first reference side S1, one side S22 of the second sealing portion 882 that faces the first reference side S1 is defined as a second reference side S22, and a virtual line that connects a center point of the third side S33 and a center point of the fourth side S44 is defined as a center line, a distance between the third side S33 and the fourth side S44 gradually increases along a direction from the first reference side S1 toward the center line (e.g., a direction opposite to the Y-axis direction), and a distance between the third side S33 and the fourth side S44 gradually increases along a direction from the second reference side S22 toward the center line (e.g., the Y-axis direction). Accordingly, the third side 33 and the fourth side 44 may have a convex lens shape. For example, the third side S33 may have a shape of "(," and the fourth side S44 may have a shape of ")."

The first and second sides S11 and S22 of the dummy area 101*d* disposed along a direction in which short sides (e.g., first and second sides S1 and S2) of the first sealing portion 881 face each other may have a straight line shape and a curved shape, respectively. For example, one of the first and second sides S11 and S22 of the dummy area 101*d* that face each other in the Y-axis direction, e.g., the first side S11, may have a straight line shape, and the other side thereof, e.g., the second side S22, may have a curved line shape. For example, of the first and second sides S11 and S22 of the dummy area 101*d* that face each other in the Y-axis direction, the first side S11 adjacent to the first sealing portion 881 may have a straight line shape, and the second side S22 adjacent to the second sealing portion 882 may have a curved line shape.

A length of the second side S22 of the dummy area 101d is greater than a length of the first side S11 of the dummy area 101d.

Figure 15:
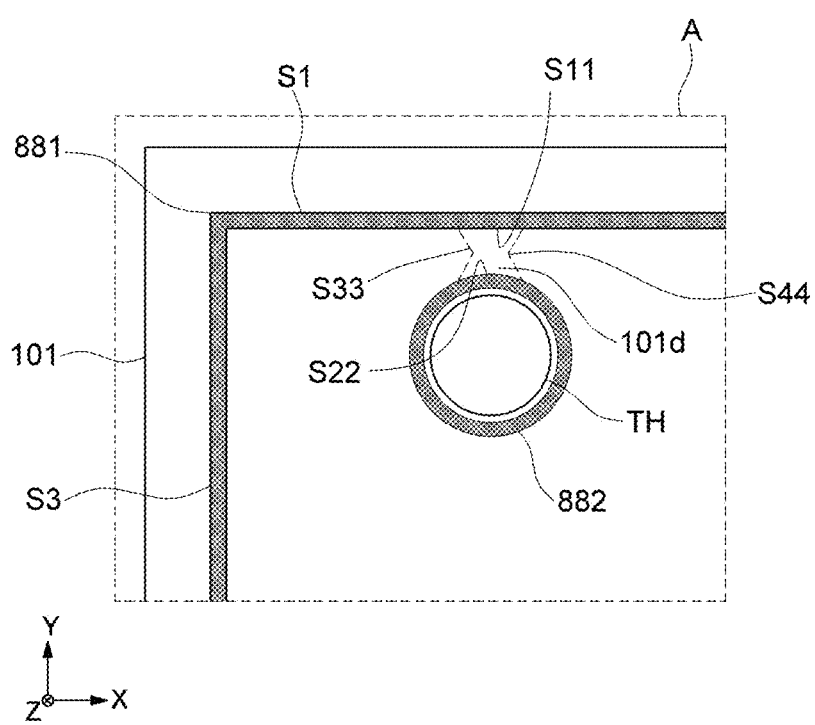
FIG. 15 is a view illustrating a dummy area according to an exemplary embodiment.

FIG. 15 is a view illustrating a dummy area 101d according to an exemplary embodiment.

As illustrated in FIG. 15, a dummy area 101d may have a polygonal shape including first, second, third, and fourth sides S11, S22, S33, and S44. In such an exemplary embodiment, the first side S11 of the dummy area 101d refers to an interface between the dummy area 101d and a first side S1 of a first sealing portion 881, and the second side S22 of the dummy area 101d refers to an interface between the dummy area 101d and a second sealing portion 882.

The third and fourth sides S33 and S44 of the dummy area 101d disposed along a direction in which long sides (e.g., third and fourth sides S3 and S4) of the first sealing portion 881 face each other may each have a straight line shape that is bent. For example, each of the third and fourth sides S33 and S44 of the dummy area 101d that face each other in the X-axis direction may have a straight line shape that is bent. For example, in an exemplary embodiment, each of the third and fourth sides S33 and S44 of the dummy area 101d that face each other in the X-axis direction may include a first straight line portion and a second straight line portion connected to the first straight line portion. An angle may be formed between the corresponding first and second straight line portions. A length of the third side S33 of the dummy area 101d and a length of the fourth side S44 of the dummy area 101d may be about equal to each other.

The third side S33 of the dummy area 101d and the fourth side S44 of the dummy area 101d may have a symmetrical shape with each other. For example, the third side S33 and the fourth side S44 may have a symmetrical shape with respect to an extending direction of a data line DL (e.g., the Y-axis direction). For example, the third side S33 and the fourth side S44 may have a symmetrical shape with respect to the extending direction of the data line DL (e.g., the Y-axis direction) that passes through a center point of the second sealing portion 882 (or a center point of a through hole TH).

When one side S1 of the first sealing portion 881 that is disposed closest to the second sealing portion 882 is defined as a first reference side S1, one side S22 of the second sealing portion 882 that faces the first reference side S1 is defined as a second reference side S22, and a virtual line that connects a center point of the third side S33 and a center point of the fourth side S44 is defined as a center line, a distance between the third side S33 and the fourth side S44 gradually decreases along a direction from the first reference side S1 toward the center line (e.g., a direction opposite to the Y-axis direction), and a distance between the third side S33 and the fourth side S44 gradually decreases along a direction from the second reference side S22 toward the center line (e.g., the Y-axis direction). For example, the third side S33 may have a shape of ">," and the fourth side S44 may have a shape of "<."

The first and second sides S11 and S22 of the dummy area 101d disposed along a direction in which short sides (e.g., first and second sides S1 and S2) of the first sealing portion 881 face each other may have a straight line shape and a curved shape, respectively. For example, one of the first and second sides S11 and S22 of the dummy area 101d that face each other in the Y-axis direction, e.g., the first side S11, may have a straight line shape, and the other side thereof, e.g., the second side S22, may have a curved line shape. For example, of the first and second sides S11 and S22 of the dummy area 101d that face each other in the Y-axis direction, the first side S11 adjacent to the first sealing portion 881 may have a straight line shape, and the second side S22 adjacent to the second sealing portion 882 may have a curved line shape.

A length of the second side S22 of the dummy area 101d is greater than a length of the first side S11 of the dummy area 101d.

Figure 16:
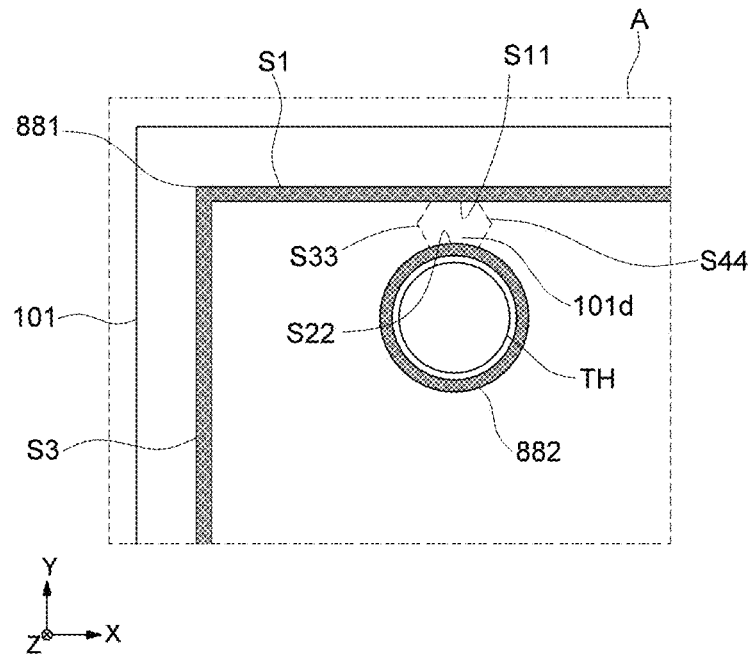
FIG. 16 is a view illustrating a dummy area according to an exemplary embodiment.

FIG. 16 is a view illustrating a dummy area 101d according to an exemplary embodiment.

As illustrated in FIG. 16, a dummy area 101d may have a polygonal shape including first, second, third, and fourth sides S11, S22, S33, and S44. In such an exemplary embodiment, the first side S11 of the dummy area 101d refers to an interface between the dummy area 101d and a first side S1 of a first sealing portion 881, and the second side S22 of the dummy area 101d refers to an interface between the dummy area 101d and a second sealing portion 882.

The third and fourth sides S33 and S44 of the dummy area 101d disposed along a direction in which long sides (e.g., third and fourth sides S3 and S4) of the first sealing portion 881 face each other may each have a straight line shape that is bent. For example, each of the third and fourth sides S33 and S44 of the dummy area 101d that face each other in the X-axis direction may have a straight line shape that is bent. For example, in an exemplary embodiment, each of the third and fourth sides S33 and S44 of the dummy area 101d that face each other in the X-axis direction may include a first straight line portion and a second straight line portion connected to the first straight line portion. An angle may be formed between the corresponding first and second straight line portions. A length of the third side S33 of the dummy area 101d and a length of the fourth side S44 of the dummy area 101d may be about equal to each other.

The third side S33 of the dummy area 101d and the fourth side S44 of the dummy area 101d may have a symmetrical shape with each other. For example, the third side S33 and the fourth side S44 may have a symmetrical shape with respect to an extending direction of a data line DL (e.g., the Y-axis direction). For example, the third side S33 and the fourth side S44 may have a symmetrical shape with respect to the extending direction of the data line DL (e.g., the Y-axis direction) that passes through a center point of the second sealing portion 882 (or a center point of a through hole TH).

When one side S1 of the first sealing portion 881 that is disposed closest to the second sealing portion 882 is defined as a first reference side S1, one side S22 of the second sealing portion 882 that faces the first reference side S1 is defined as a second reference side S22, and a virtual line that connects a center point of the third side S33 and a center point of the fourth side S44 is defined as a center line, a distance between the third side S33 and the fourth side S44 gradually increases along a direction from the first reference side S1 toward the center line (e.g., a direction opposite to the Y-axis direction), and a distance between the third side S33 and the fourth side S44 gradually increases along a direction from the second reference side S22 toward the center line (e.g., the Y-axis direction). For example, the third side S33 may have a shape of "<," and the fourth side S44 may have a shape of ">."

The first and second sides S11 and S22 of the dummy area 101d disposed along a direction in which short sides (e.g., first and second sides S1 and S2) of the first sealing portion 881 face each other may have a straight line shape and a curved shape, respectively. For example, one of the first and second sides S11 and S22 of the dummy area 101d that face each other in the Y-axis direction, e.g., the first side S11, may have a straight line shape, and the other side thereof, e.g., the second side S22, may have a curved line shape. For example, of the first and second sides S11 and S22 of the dummy area 101d that face each other in the Y-axis direction, the first side S11 adjacent to the first sealing portion 881 may have a straight line shape, and the second side S22 adjacent to the second sealing portion 882 may have a curved line shape.

A length of the second side S22 of the dummy area 101d is greater than a length of the first side S11 of the dummy area 101d.

Alternatively, in an exemplary embodiment, the second sealing portion 882 of FIGS. 11 to 16 may be disposed close to the second side S2 of the first sealing portion 881 that is close to the pad area 101c.

Figure 17:
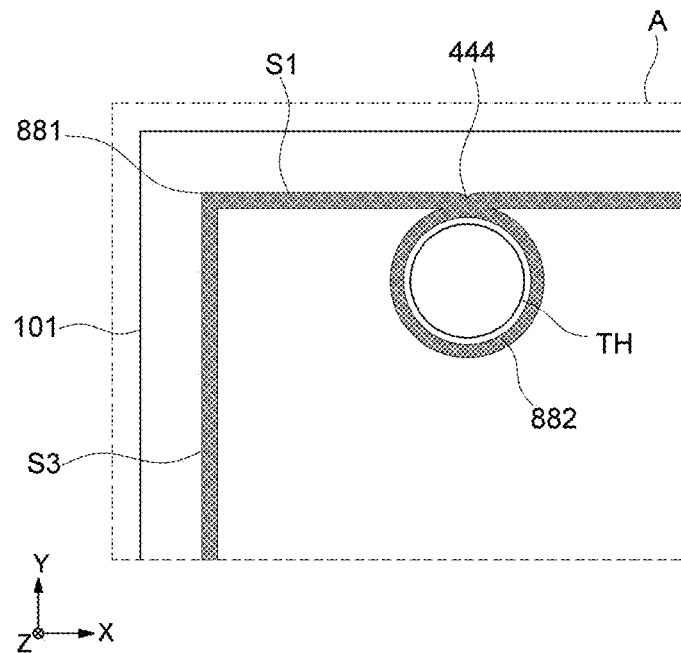
FIG. 17 is a plan view illustrating a first sealing portion and a second sealing portion according to an exemplary embodiment.

FIG. 17 is a plan view illustrating a first sealing portion 881 and a second sealing portion 882 according to an exemplary embodiment.

As illustrated in FIG. 17, in an exemplary embodiment, the second sealing portion 882 may be connected to the first sealing portion 881. For example, the second sealing portion 882 may be connected to a first side of the first sealing portion 881 that is closest to the second sealing portion 882.

The first sealing portion 881 may have a notch 444 at a connection point between the first sealing portion 881 and the second sealing portion 882. For example, the notch 444 may be located at a portion of the first sealing portion 881 opposite to a contact surface between the first sealing portion 881 and the second sealing portion 882.

Alternatively, in an exemplary embodiment, the second sealing portion 882 may be connected to a second side S2 of the first sealing portion 881 that is close to the pad area 101c.

Figure 18A:
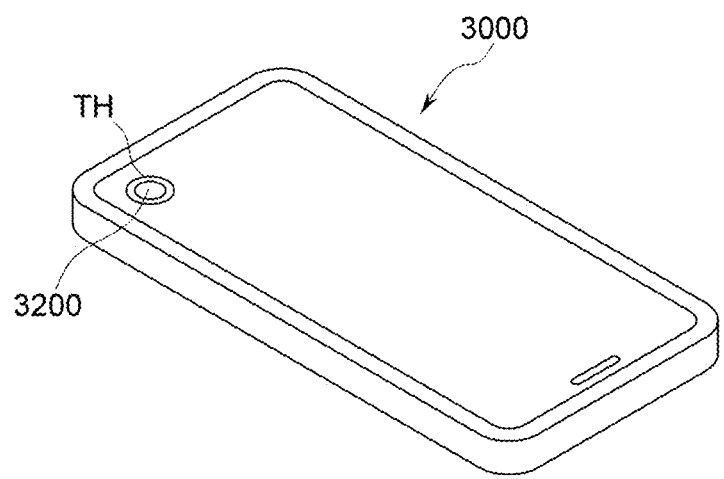
FIGS. 18A to 18C are views illustrating electronic devices that include the display devices according to exemplary embodiments.
Figure 18B:
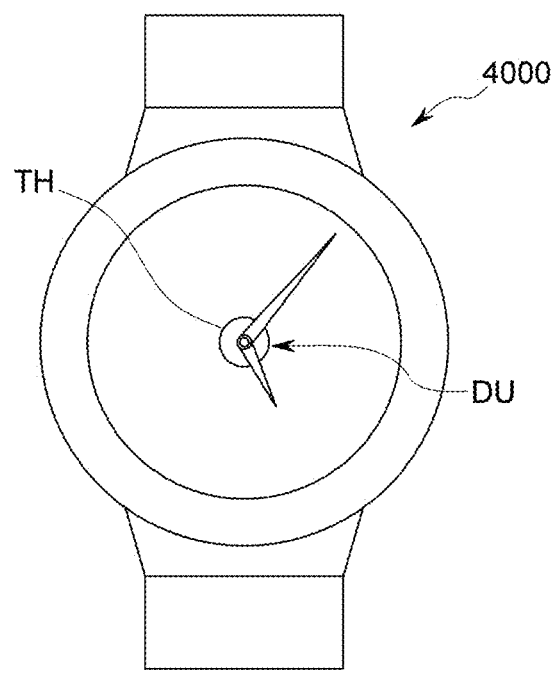
Figure 18C:
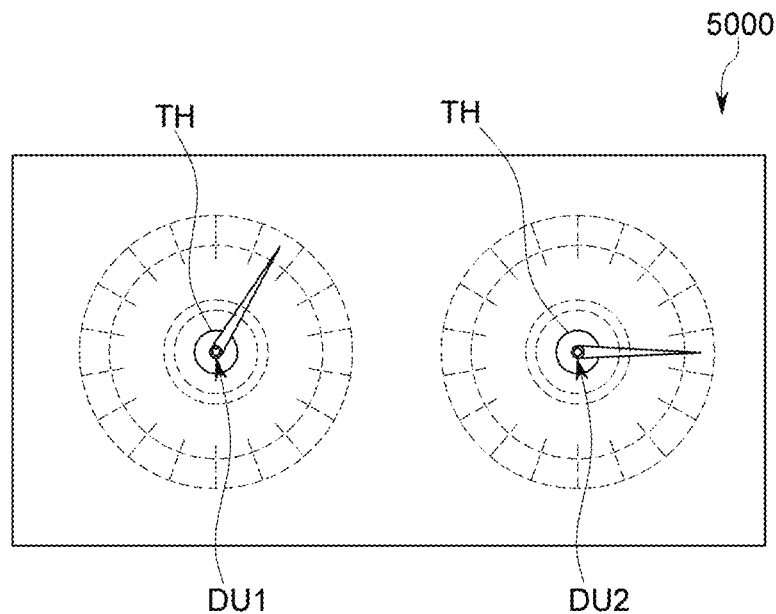

FIGS. 18A to 18C are views illustrating electronic devices that include the display devices according to exemplary embodiments.

Referring to FIG. 18A, the display device 1000 according to the above-described exemplary embodiments may be applied to a smartphone 3000. An element 3200, e.g., a camera, may be located in the through hole TH. For example, the element 3200, e.g., a camera, may be located in an area enclosed by the second sealing portion 882.

Referring to FIG. 18B, the display device 1000 according to the above-described exemplary embodiments may be applied to a smartwatch 4000. A driving unit DU that includes a minute hand and an hour hand may be disposed in the through hole TH. For example, the driving unit DU may be disposed in an area enclosed by the second sealing portion 882.

Referring to FIG. 18C, the display device 1000 according to the above-described exemplary embodiments may be applied to an instrument panel 5000 for a vehicle. A first driving unit DU1 that includes a needle indicating an engine speed RPM and a second driving unit DU2 that includes a needle indicating a speed may be provided in the through holes TH, respectively. For example, the first driving unit DU1 and the second driving unit DU2 may be disposed in two areas enclosed by two second sealing portions 882, respectively.

The display device of the present invention may be an LED device that includes the light emitting layer 512 as a display element. However, the display device of the present invention is not limited thereto. For example, the display device of the present invention may be an LCD device that includes a liquid crystal layer as its display element.

As set forth above, display devices according to one or more exemplary embodiments may provide the following effects.

A through hole at which, for example, a camera, may be installed is located in a display area, and thus a display area for displaying images of the display device may be widened.

In addition, since the through hole is sealed by a sealing portion, a path along which moisture may permeate through the through hole may be blocked.

While the present invention has been illustrated and described with reference to the exemplary embodiments thereof, it will be apparent to those of ordinary skill in the art that various changes in form and detail may be made thereto without departing from the spirit and scope of the present invention as defined by the following claims.

What is claimed is:

1. A display device, comprising:
a first substrate comprising a display area and a non-display area;
a display element disposed on the display area of the first substrate;
a first sealing portion disposed on the non-display area of the first substrate;
a second substrate facing the first substrate in a first direction;
a hole defined through the first substrate and the second substrate along the first direction in the display area; and
a second sealing portion disposed between the first substrate and the second substrate and enclosing the hole, and
the second sealing portion is connected to the first sealing portion.

2. The display device of claim 1, wherein the second sealing portion has a circular shape.

3. The display device of claim 1, wherein a width of the second sealing portion is less than a width of the first sealing portion.

4. The display device of claim 1, further comprising at least one of:
a first heat transfer layer disposed between the first substrate and the first sealing portion; and
a second heat transfer layer disposed between the first substrate and the second sealing portion.

5. The display device of claim 4, wherein the first heat transfer layer contacts the first sealing portion, and
the second heat transfer layer contacts the second sealing portion.

6. The display device of claim 1, wherein the non-display area of the first substrate comprises a pad area that does not overlap the second substrate, and a non-pad area that overlaps the second substrate,
a first side of first and second sides of the first sealing portion that face each other is more adjacent to the non-pad area, and
the second sealing portion is connected to the first side.

7. The display device of claim 1, wherein the non-display area of the first substrate comprises a pad area that does not overlap the second substrate, and a non-pad area that overlaps the second substrate,
a first side of first and second sides of the first sealing portion that face each other is more adjacent to the non-pad area, and
the second sealing portion is connected to the second side.

8. The display device of claim 1, wherein the first sealing portion has a notch.

9. The display device of claim 8, wherein the notch is located at a portion of the first sealing portion opposite to a contact surface between the first sealing portion and the second sealing portion.

* * * * *